United States Patent
Tsuboi et al.

(10) Patent No.: US 7,880,951 B2
(45) Date of Patent: Feb. 1, 2011

(54) MICRO OSCILLATING DEVICE AND MICRO OSCILLATING DEVICE ARRAY

(75) Inventors: Osamu Tsuboi, Kawasaki (JP); Norinao Kouma, Kawasaki (JP); Hiromitsu Soneda, Kawasaki (JP); Hisao Okuda, Kawasaki (JP); Yoshihiro Mizuno, Kawasaki (JP); Tsuyoshi Matsumoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 271 days.

(21) Appl. No.: 12/059,859

(22) Filed: Mar. 31, 2008

(65) Prior Publication Data

US 2008/0239456 A1  Oct. 2, 2008

(30) Foreign Application Priority Data

Mar. 30, 2007 (JP) ............................. 2007-094568

(51) Int. Cl.
  *G02B 26/00* (2006.01)
(52) U.S. Cl. ...................................... 359/290; 359/291
(58) Field of Classification Search ................. 359/290, 359/291
  See application file for complete search history.

(56) References Cited

U.S. PATENT DOCUMENTS

| | | | |
|---|---|---|---|
| 6,806,992 B2 | 10/2004 | Soneda et al. | |
| 6,995,495 B2* | 2/2006 | Ko et al. | 310/309 |
| 7,038,830 B2 | 5/2006 | Tsuboi et al. | |
| 2006/0008201 A1 | 1/2006 | Miller et al. | |
| 2006/0120425 A1 | 6/2006 | Kouma et al. | |
| 2008/0054758 A1* | 3/2008 | Tsuboi et al. | 310/309 |

FOREIGN PATENT DOCUMENTS

| | | |
|---|---|---|
| JP | 11-248733 A | 9/1999 |
| JP | 2003-019700 A | 1/2003 |
| JP | 2003-344785 A | 12/2003 |
| JP | 2004-341364 A | 12/2004 |
| JP | 2005-305582 A | 11/2005 |
| JP | 2005-305607 A | 11/2005 |
| JP | 2006-072252 A | 3/2006 |
| JP | 2006-162699 A | 6/2006 |

OTHER PUBLICATIONS

European Search Report dated Dec. 17, 2009, issued in corresponding European Patent Application No. 08103114.8.
Korean Office Action dated Jun. 26, 2009 (mailed date), issued in corresponding Korean Patent Application No. 10-2008-0029368.

* cited by examiner

*Primary Examiner*—Jordan M. Schwartz
*Assistant Examiner*—James C Jones
(74) *Attorney, Agent, or Firm*—Fujitsu Patent Center

(57) ABSTRACT

A micro oscillating device includes a frame, an oscillating part including a first drive electrode for application of a reference electric potential, and a connecting part for connecting the frame and the oscillating part to each other, where the connecting part defines an axis of an oscillating motion of the oscillating part. A second drive electrode is fixed to the frame to cooperate with the first drive electrode for generation of a driving force for the oscillating movement. The first drive electrode includes a first end extension and a second end extension separated from each other and extending in a direction crossing the axis. The second drive electrode is within a separation distance between the first and the second end extensions.

14 Claims, 22 Drawing Sheets

112

MICRO OSCILLATING DEVICE AND MICRO OSCILLATING DEVICE ARRAY

BACKGROUND OF THE INVENTION

1. Field of the Invention

The present invention relates to micro oscillating devices such as micromirror devices, acceleration sensors, angular-speed sensors and vibration devices which have tiny moving parts or oscillating parts. The present invention also relates to-micro oscillating device arrays.

2. Description of the Related Art

In recent years, efforts are being made in many technical fields for making practical application of devices which have a micro-structure formed by micromachining technology. Such devices include micromirror devices, acceleration sensors, angular-speed sensors and other micro oscillating devices which have tiny moving parts or vibrating parts therein. Micromirror devices are used in the field of optical disc technology and optical communications technology for example, as a light reflection device. Acceleration sensors and angular-speed sensors find their ways in the field of correction of camera shake in video cameras and cameras incorporated in mobile telephones, car navigation systems, air bag release timing control system, attitude control of automobiles and robots, and so on. These micro oscillating devices generally include a fixed part, a moving part, and a connecting part which connects the fixed part and the moving part. These micro oscillating devices are disclosed in JP-A-2003-19700, JP-A-2004-341364, and JP-A-2006-72252, for example.

Micro oscillating devices often uses, as their driving mechanism, an electrostatic actuator for generation of a driving force. The driving force is provided by an electrostatic attraction when a voltage is applied between a pair of electrodes. A problem with the electrostatic actuator is that when the voltage is applied, an electric field formed by the electrode pair can leak out of the actuator. It has been known that the electric field leakage is apt to occur in comb-teeth type electrostatic actuators for example.

In a case where two micro oscillating devices are placed closely to each other, electric field leakage from one electrostatic actuator can cause an adverse affect to the drive characteristic of the adjacent micro oscillating device. For example, in a micromirror device array which includes a plurality of micromirror devices, i.e. micro oscillating devices, which are laid in one-dimensional or two-dimensional manner, electric field leakage from the electrostatic actuator of one micromirror device can cause an adverse affect to the drive characteristic of other, adjacent micro oscillating devices. In order to eliminate the adverse affect to the drive characteristic caused by the electric field leakage in micromirror device arrays (micro oscillating device arrays), the micromirror devices (the micro oscillating devices) must be spaced from each other by a sufficiently large pitch. In other words, electric field leakage is a problem in an effort for increased device density in the micro oscillating device arrays.

SUMMARY OF THE INVENTION

The present invention has been proposed under the above-described circumstances, and it is therefore an object of the present invention to provide a micro oscillating device and a micro oscillating device array which are suitable to reduce the electric field leakage to the outside of the device.

A first aspect of the present invention provides a micro oscillating device that includes: at leas one frame; an oscillating part which has a first drive electrode for application of a reference electric potential; a connecting part which connects the frame and the oscillating part to each other, thereby define an axis of an oscillating motion of the oscillating part; and a second drive electrode fixed to the frame and cooperating with the first drive electrode to generate a driving force for the oscillating movement. The first drive electrode has a first end extension and a second end extension which are separated from each other and extend in a direction crossing the axis. The second drive electrode is within a separation distance between the first and the second end extensions. The first and the second end extensions are the outermost parts in the structure of the driving mechanism which is constituted by the first and the second drive electrodes, in the direction of extension of the axis which is an axis that is related to the oscillating part.

The micro oscillating device of the present invention can be driven by applying a voltage between the first and the second drive electrodes. Specifically, when operating the present micro oscillating device, a predetermined reference potential is applied to the first drive electrode. The reference potential is a ground potential for example. Under this state, a predetermined drive potential which is higher than the reference potential is applied to the second drive electrode to generate an electrostatic attraction between the first and the second drive electrodes. By using the electrostatic attraction as the driving force, it is possible to cause the oscillating part to make an oscillating movement, i.e. to make a pivotal displacement. By controlling the potential difference between the reference potential and the drive potential, it is possible to control the electrostatic attraction, and therefore to control the amount of pivotal displacement of the oscillating part.

The first and the second end extensions, which constitute part of the first drive electrode in the present micro oscillating device, provide the outermost parts in the structure of driving mechanism (the first drive electrode and the second drive electrode) in the direction of extension of the axis that is an axis relevant to the oscillating part. Further, when the device is in operation, the reference potential (a ground potential for example) is applied to the first drive electrode including the first and the second end extensions. The second drive electrode is placed within a separation distance between such a specific structure provided by the first and the second end extensions. Therefore, as a predetermined drive potential which is higher than the reference potential generates an electric field from the second drive electrode during device operation, the electric field is likely to be absorbed by the first and the second end extensions in the first drive electrode (In other words, the electric field generated from the second drive electrode is not likely to leak out of the driving mechanism beyond the first and the second end extensions). Therefore, the present micro oscillating device is suitable for reducing leakage of the electric field to outside of the device when the device is in operation. Such a micro oscillating device as described is suitable for constituting a micro oscillating device array which has a high device density.

The micro oscillating device according to the first aspect of the present invention may further include: an additional frame; an additional connecting part which connects the frame and the additional frame, and defines an additional axis extending in a direction crossing the axis for the oscillating movement of the frame; and a driving mechanism for generation of a driving force for the oscillating movement of the frame. The micro oscillating device of the present invention may be a dual-axis movable device having the above arrangement.

Preferably, the first drive electrode may include a plurality of electrode teeth which extend from the first end extension toward the second end extension in parallel to each other at a space provided in the direction which the first end extension extends, and a plurality of electrode teeth which extend from the second end extension toward the first end extension in parallel to each other at a space provided in the direction which the second end extension extends. Further, the second drive electrode may include an arm which extends along the first and the second end extensions, a plurality of electrode teeth which extend from the arm toward the first end extension in parallel to each other at a space provided in the direction which the arm extends, and a plurality of electrode teeth which extend from the arm toward the second end extension in parallel to each other at a space provided in the direction which the arm extends. Such an arrangement as the above for the driving mechanism is suitable for reducing electric field leakage to the outside of the driving mechanism, i.e. for reducing electric field leakage to the outside of the device. In addition, the arrangement reduces so-called pull-in phenomenon. Therefore, the arrangement is suitable to achieve a large amount of pivotal displacement of the oscillating part.

Preferably, the first drive electrode may include a plurality of electrode teeth which extend toward the second drive electrode in parallel to each other at a space provided in the direction which the axis extends. The first and the second end extensions provide two endmost electrode teeth in the first drive electrode. The second drive electrode may include a plurality of electrode teeth which extend toward the first drive electrode in parallel to each other at a space provided in the direction which the axis extends. Such an arrangement as the above for the driving mechanism is preferable in reducing electric field leakage to outside of the driving mechanism, i.e. in reducing electric field leakage to outside of the device.

Preferably, the oscillating part may further include a movable functioning section and a first shielded electrode part. The first shielded electrode part is between the movable functioning section and the second drive electrode. The first shielded electrode part is a part for absorbing an electric field which tends to leak out of the driving mechanism or an electric field which has leaked out of the driving mechanism, and so the first shielded electrode part is supplied with a ground potential for example. The present micro oscillating device may be obtained from a material substrate which has a laminate structure constituted by a first conductive layer, a second conductive layer and an insulation layer between the first and the second conductive layers. In this case, for example, the movable functioning section is a part which is formed in the first conductive layer whereas the second drive electrode and the first shielded electrode part are parts which are formed in the second conductive layer.

Preferably, the micro oscillating device may further include a second shielded electrode part which is bonded to the arm via an insulation layer. The second shielded electrode part is a part for absorbing an electric field which tends to leak out of the driving mechanism, and so the second shielded electrode part is supplied with a ground potential for example. Such an arrangement as the above is preferable in reducing electric field leakage to outside of the driving mechanism, i.e. in reducing electric field leakage to outside of the device. The present micro oscillating device may be obtained from a material substrate which has a laminate structure constituted by a first conductive layer, a second conductive layer and an insulation layer between the first and the second conductive layers. In this case, for example, the second shielded electrode part is a part formed in the first conductive layer whereas the arm is a part formed in the second conductive layer.

Preferably, the frame may include a frame main body and a third shielded electrode part. The third shielded electrode part is a part for absorbing an electric field which has leaked out of the driving mechanism, and so the third shielded electrode part is supplied with a ground potential for example. The arrangement that the frame which defines the outer perimeter of the device has a third shielded electrode part is preferable in reducing electric field leakage to outside of the device. The present micro oscillating device may be obtained from a material substrate which has a laminate structure constituted by a first conductive layer, a second conductive layer and an insulation layer between the first and the second conductive layers. In this case, for example, the first drive electrode and the third shielded electrode part are formed in the first conductive layer whereas the second drive electrode and frame main body are formed in the second conductive layer.

Preferably, the first, the second and the third shielded electrode parts as well as the first drive electrode may be electrically connected with each other. According to such an arrangement as the above, the reference potential is supplied not only to the first drive electrode but also to each of the shielded electrode parts when the device is in operation.

Preferably, the frame main body may include the fourth shielded electrode part. The fourth shielded electrode part is a part for absorbing an electric field which has leaked out of the driving mechanism, and so the fourth shielded electrode part is supplied with a ground potential for example. The arrangement that the frame main body which defines the outer perimeter of the device has a fourth shielded electrode part is preferable in reducing electric field leakage to outside of the device.

Preferably, the first, the second, the third and the fourth shielded electrode parts as well as the first drive electrode may be electrically connected with each other. According to such an arrangement as the above, the reference potential is supplied not only to the first drive electrode but also to each of the shielded electrode parts when the device is in operation.

A second aspect of the present invention provides a micro oscillating device array that includes a plurality of the micro oscillating device according to the first aspect of the present invention. Such a micro oscillating device array as this is suitable for achieving a high device density.

Preferably, the axes in the micro oscillating devices may be parallel to each other. It is preferable that the reference potential is applicable commonly to the first drive electrodes of the oscillating parts in the micro oscillating devices whereas an electric potential is applicable individually to the second drive electrode in each of the micro oscillating devices.

DETAILED DESCRIPTION OF THE PREFERRED EMBODIMENTS

Figure 1:
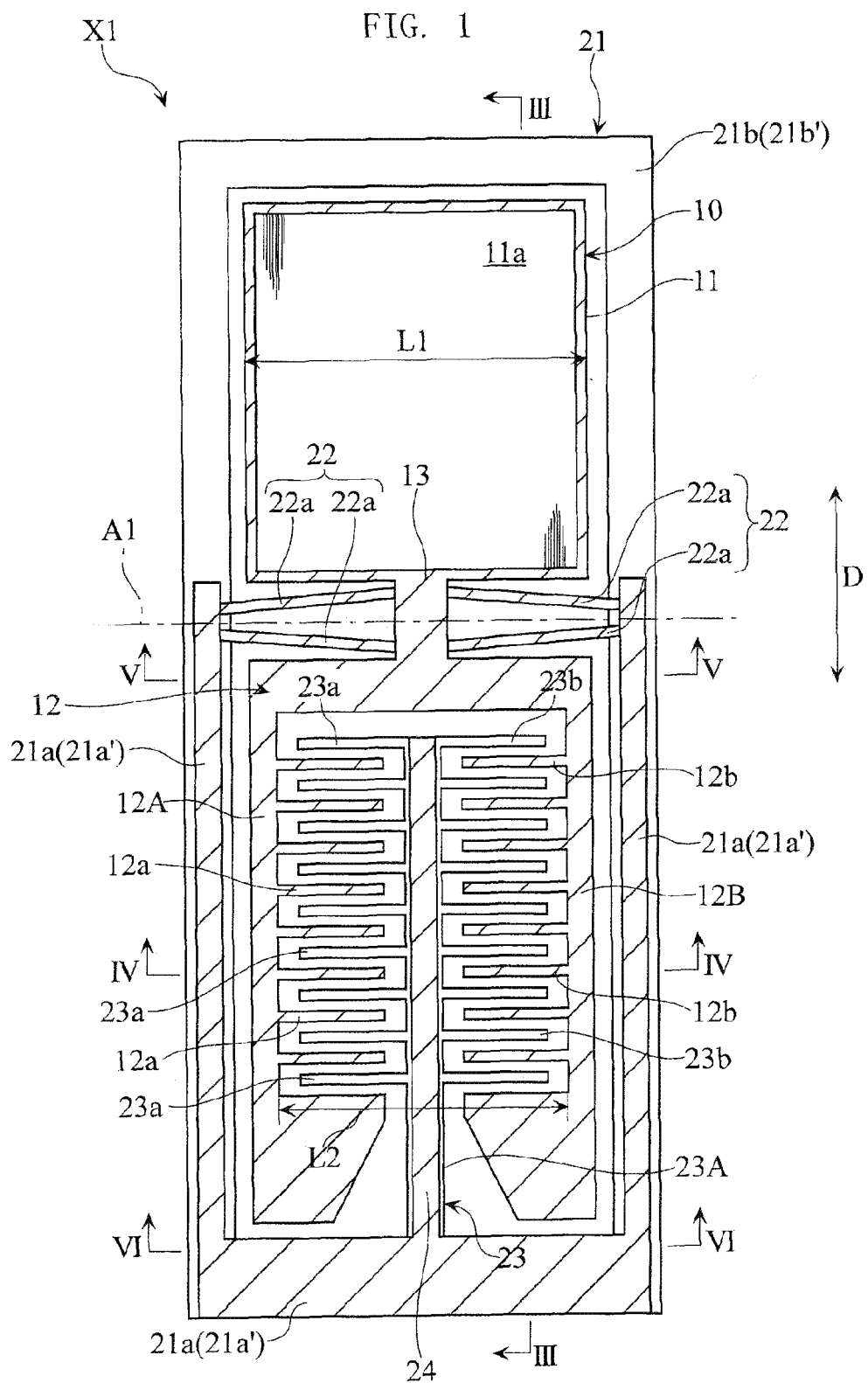
FIG. 1 is a plan view of a micro oscillating device according to a first embodiment of the present invention.
Figure 2:
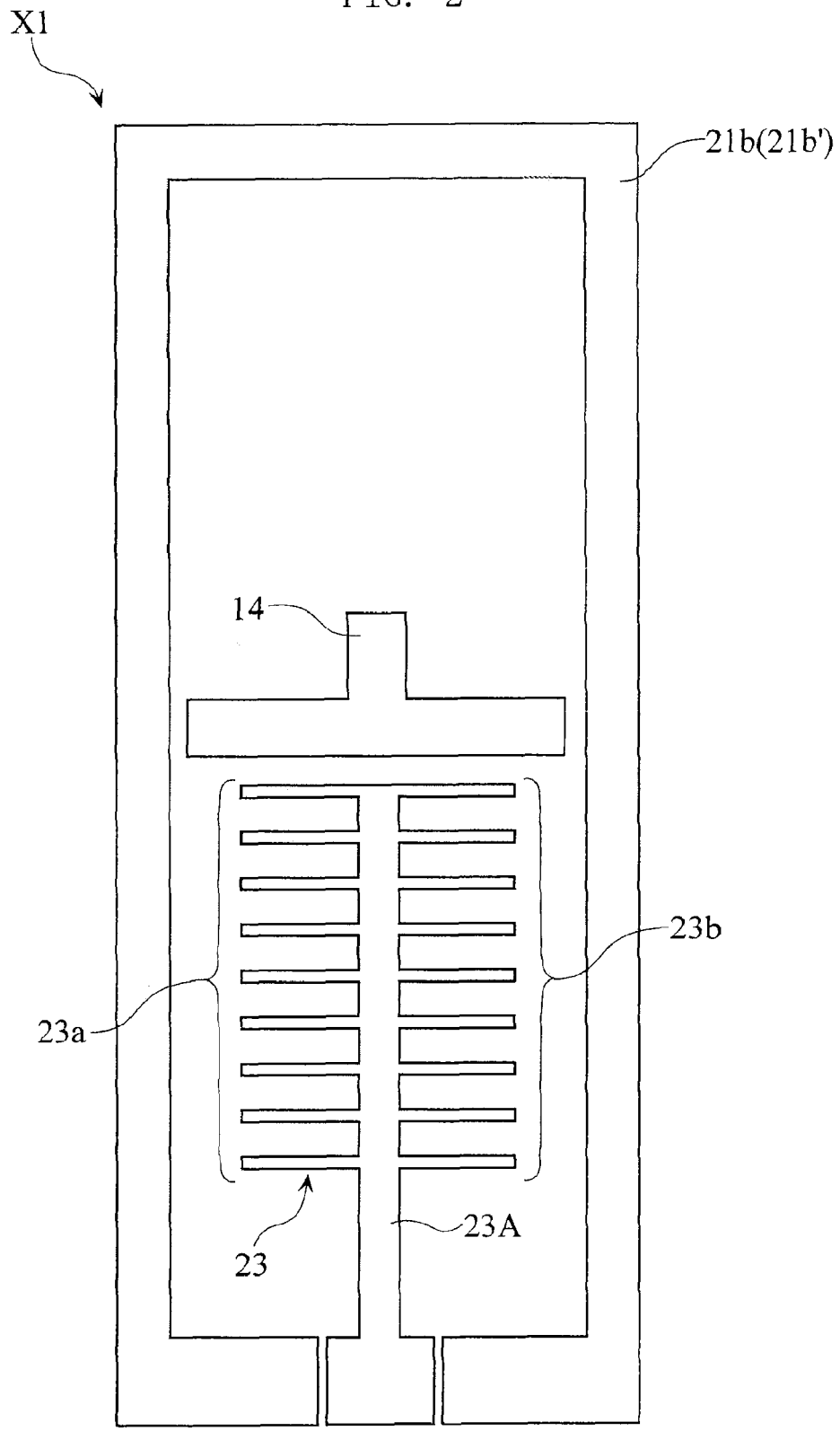
FIG. 2 is a partially unillustrated plan view of the micro oscillating device in FIG. 1.
Figure 3:
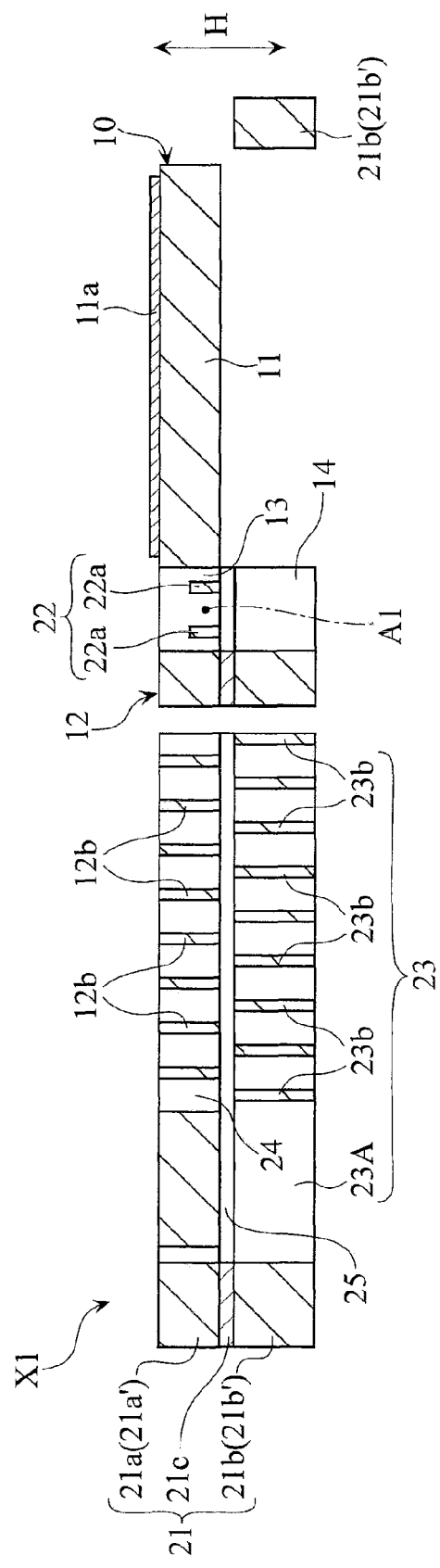
FIG. 3 is a sectional view taken along lines III-III in FIG. 1.
Figure 4:
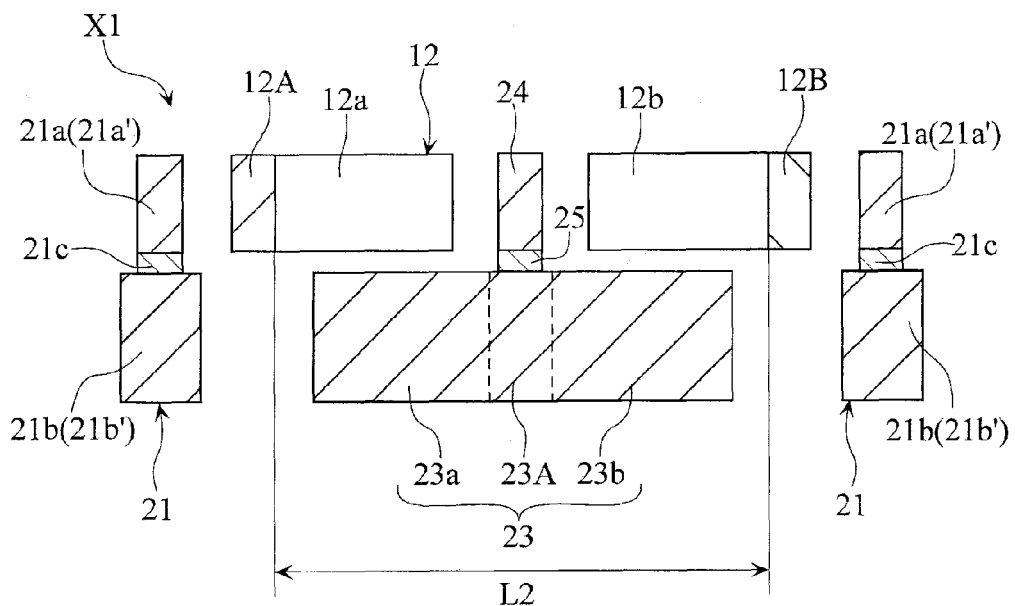
FIG. 4 is an enlarged sectional view taken along lines IV-IV in FIG. 1.
Figure 5:
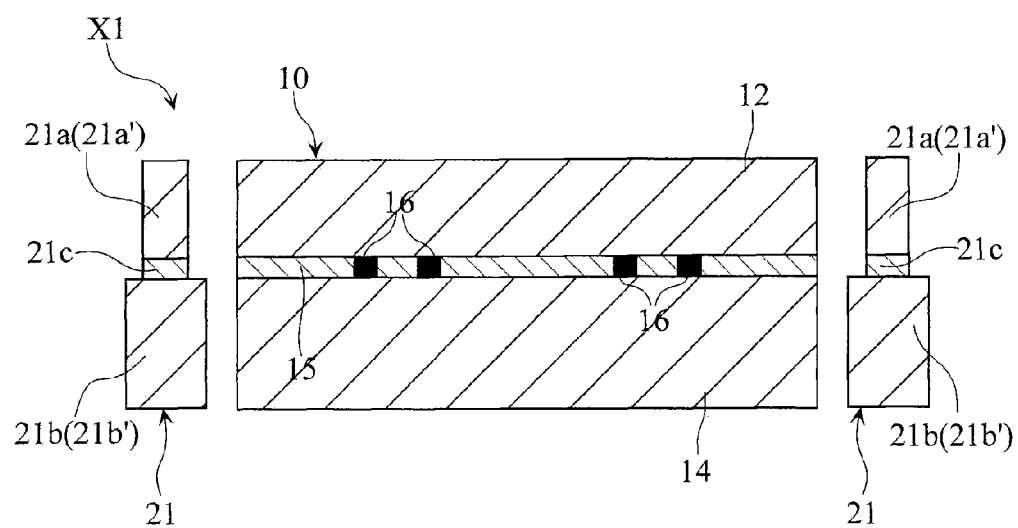
FIG. 5 is an enlarged sectional view taken along lines V-V in FIG. 1.
Figure 6:
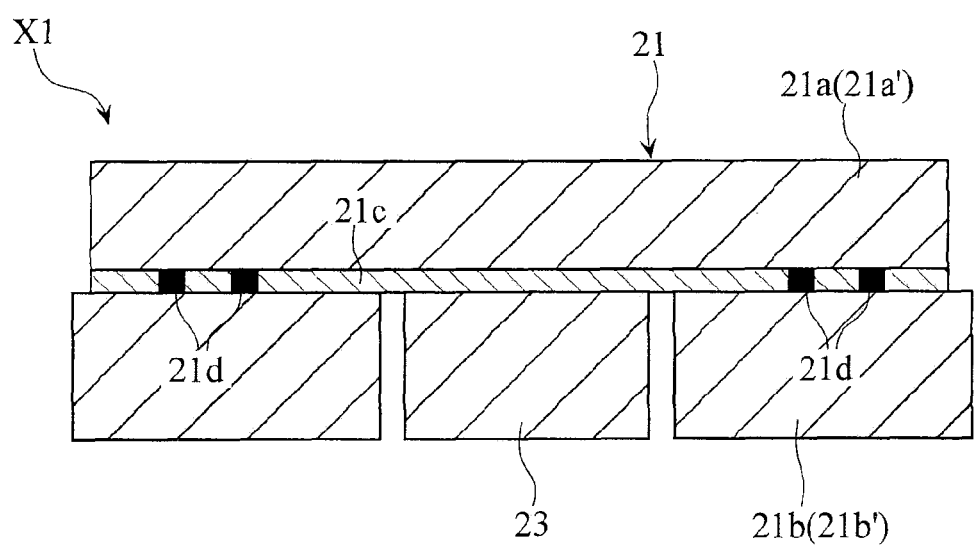
FIG. 6 is an enlarged sectional view taken along lines VI-VI in FIG. 1.

FIG. 1 through FIG. 6 show a micro oscillating device X1 according to a first embodiment of the present invention. FIG. 1 is a plan view of the micro oscillating device X1. FIG. 2 is a partially unillustrated plan view of the micro oscillating device X1. FIG. 3 is a sectional view taken along lines III-III in FIG. 1. FIG. 4 through FIG. 6 are enlarged sectional views taken along lines IV-IV, V-V, and VI-VI in FIG. 1, respectively.

The micro oscillating device X1 includes an oscillating part 10, a frame 21, a pair of connecting parts 22, a drive electrode 23 and a shielded electrode part 24. In the present embodiment, the device X is a micromirror device. The micro oscillating device X1 is manufactured by bulk micromachining technology such as MEMS technology, from a material substrate provided by an SOI (Silicon On Insulator) wafer. The material substrate has a laminate structure constituted by a first and a second silicon layers and an insulation layer between the silicon layers. Each silicon layer has a predetermined electrical conductivity through doping with impurity. The above-mentioned parts in the micro oscillating device X1 are primarily formed in the first silicon layer and/or the second silicon layer. For the sake of illustrative clarity, hatching is provided in FIG. 1 on those parts which are formed in the first silicon layer and higher than the insulation layer toward the viewer of the figure. In FIG. 2, the structure shown is formed in the second silicon layer in the micro oscillating device X1.

The oscillating part 10 includes a land 11, a drive electrode 12, a beam 13 and a shielded electrode part 14.

The land 11 is a part formed in the first silicon layer, and has a surface provided with a mirror surface 11a which is capable of reflecting light. The land 11 and the mirror surface 11a constitute a movable functioning section according to the present invention. A length L1 indicated in FIG. 1 for the land 11 or the movable functioning section is 20 through 300 μm for example.

The drive electrode 12 is a part formed in the first silicon layer, and includes a pair of arms 12A, 12B, a plurality of electrode teeth 12a, and a plurality of electrode teeth 12b. The arms 12A, 12B are parallel to each other in a direction indicated by Arrow D shown in FIG. 1, and serve as the first and the second end extensions according to the present invention. As shown in FIG. 1 and FIG. 4, the electrode teeth 12a extend from the arm 12A toward the arm 12B, in parallel to each other at a space provided in the direction in which the arm 12A extends. The electrode teeth 12b extend from the arm 12B toward the arm 12A, in parallel to each other at a space provided in the direction in which the arm 12B extends. The drive electrode 12 is a part where a predetermined reference potential (a ground potential for example) is applied when operating the micro oscillating device X1. The drive electrode 12 as described above serves as the first drive electrode according to the present invention.

The beam 13 is a part formed in the first silicon layer, and connects the land 11 and the drive electrode 12.

As shown in FIG. 2, the shielded electrode part 14 is a part formed in the second silicon layer, and is bonded to the drive electrode 12 via an insulating layer 15 as shown in FIG. 5. The shielded electrode part 14 and the drive electrode 12 are electrically connected with each other by electrically conductive vias 16 which penetrate the insulation layer 15. The shielded electrode part 14 as described serves as the first shielded electrode part according to the present invention.

As shown in FIG. 3 and FIG. 6 for example, the frame 21 has a laminate structure including a first-layer piece 21a formed in the first silicon layer, a second-layer piece 21b formed in the second silicon layer and an insulation layer 21c between the first and the second layer-pieces 21a, 21b. As shown in FIG. 1, the first-layer piece 21a is a shielded electrode part 21a' which surrounds the oscillating part 10 partially. The shielded electrode part 21a' serves as the third shielded electrode part according to the present invention. The second-layer piece 21b is a frame main body which surrounds the oscillating part 10 entirely, and also is a shielded electrode part 21b'. The shielded electrode part 21b' serves as the fourth shielded electrode part according to the present invention. As shown in FIG. 6, the first-layer piece 21a and the second-layer piece 21b are electrically connected with each other by electrically conductive vias 21d which penetrate the insulation layer 21c.

As shown in FIG. 1, each of the connecting parts 22 is provided by two torsion bars 22a. Each torsion bar 22a is a part formed in the first silicon layer, connects with the beam 13 of the oscillating part 10 as well as with the first-layer piece 21a of the frame 21, thereby connecting the oscillating part 10 and the frame 21 together. The torsion bars 22a provide electrical connection between the beam 13 and the first-layer piece 21a. The two torsion bars 22a in each of the connecting part 22 are spaced from each other by a gap, which gradually increases from the frame 21 toward the oscillating part 10. As shown in FIG. 3, the torsion bars 22a are thinner than the oscillating part 10 in a device thickness direction H, and thinner than the first-layer piece 21a of the frame 21. The pair of connecting parts 22 as described defines an axis A1 of oscillating motion of the oscillating part 10, i.e. of the land 11. The axis A1 is perpendicular to the direction indicated by Arrow D in FIG. 1, i.e. perpendicular to the direction in which the arms 12A, 12B of the drive electrode 12 extend, and preferably, passes through or near the center of gravity of the oscillating part 10. The connecting parts 22, each including two torsion bars 22a whose gap in between increases gradually from the frame 21 toward the land 11, are suitable for reduced generation of displacement components which are unnecessary for the oscillating motion of the land 11.

As shown clearly in FIG. 2, the drive electrode 23 is a part formed in the second silicon layer, and is constituted by an arm 23A, a plurality of electrode teeth 23a, and a plurality of electrode teeth 23b. The arm 23A extends in the direction indicated by Arrow D in FIG. 1. The electrode teeth 23a extend from the arm 23A toward the arm 12A of the drive electrode 12 in parallel to each other at a space provided in the direction in which the arm 23A extends. The electrode teeth 23b extend from the arm 23A toward the arm 12B of the drive electrode 12 in parallel to each other at a space provided in the direction in which the arm 23A extends.

The shielded electrode part 24 is a part formed in the first silicon layer, and as shown in FIG. 4 for example, bonded to the arm 23A of the drive electrode 23 via the insulation layer 25. The shielded electrode part 24 and the drive electrode 23 are electrically separated from each other. As shown in FIG. 1, the shielded electrode part 24 is continuous to and electrically connected with the first-layer piece 21a of the frame 21 (shielded electrode part 21a'). The shielded electrode part 24 as described serves as the second shielded electrode part according to the present invention.

In the micro oscillating device X1, a pair of drive electrodes 12, 23, constitutes a driving mechanism, i.e. an actuator, for generation of a driving force necessary to move the oscillating part 10. In the driving mechanism, the arms 12A, 12B (the first and the second end extensions) of the drive electrode 12 extend, at a space from each other, in a direction perpendicular to the axis A1. The arms 12A, 12B, i.e. a pair of end extensions, provide the outermost parts in the structure of the driving mechanism constituted by the drive electrodes 12, 23 in the direction of extension of the axis A1 which is an axis relevant to the oscillating part 10. As shown in FIG. 1 and FIG. 4, the drive electrode 23 is provided within a separation distance L2 between the arms 12A, 12B described as above. The separation distance L2 is 10 through 300 μm for example.

Figure 7:
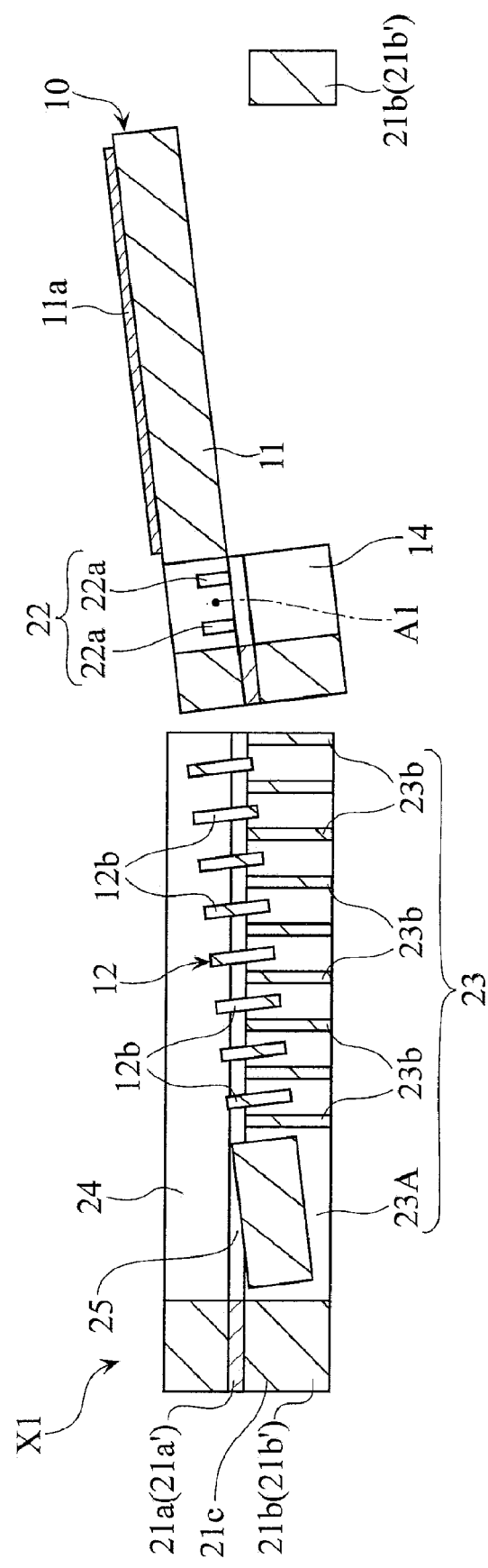
FIG. 7 is a sectional view taken along lines III-III in FIG. 1, showing a state during operation.

When operating the micro oscillating device X1, a predetermined reference potential is applied to the drive electrode 12 of the oscillating part 10 as described earlier. The application of reference potential to the drive electrode 12 can be achieved via the first-layer piece 21a of the frame 21, the torsion bars 22a of the connecting parts 22, and the beam 13 of the oscillating part 10. The reference potential is a ground potential for example, and preferably, maintained at a constant level. Then, by applying a drive potential which is higher than the reference potential to the drive electrode 23, an electrostatic attraction is generated between the drive electrodes 12, 23 (between the electrode teeth 12a, 23a, and between the electrode teeth 12b, 23b). When the electrostatic attraction between the drive electrodes 12, 23 is equal to or grater than a predetermined level, the drive electrode 12 is drawn toward the drive electrode 23. As a result, the oscillating part 10, i.e. the land 11, makes an oscillating movement about the axis A1, making a pivotal displacement to an angle where the electrostatic attraction is balanced by a total of torsional resistances of the twisted connecting torsion bars 22a. When balanced, the drive electrodes 12, 23 come to a state of orientation illustrated in FIG. 7 for example. The amount of pivotal displacement in such an oscillating movement can be controlled by varying the amount of electric potential applied to the drive electrode 23. When the electrostatic attraction between the drive electrodes 12, 23 is turned off, each of the torsion bars 22a returns to its natural state, allowing the oscillating part 10, i.e. the land 11, to come to a state of orientation illustrated in FIG. 3 for example. Through the oscillating drive of the oscillating part 10, i.e. of the land 11, as described, it is possible to change light reflection directions of the light reflected by the mirror surface 11a provided on the land 11.

The arms 12A, 12B, which constitute part of the drive electrode 12 in the micro oscillating device X1, provide the outermost parts in the structure of the driving mechanism constituted by the drive electrodes 12, 23 in the direction of extension of the axis A1 which is an axis relevant to the oscillating part 10. Further, when the device is in operation, a reference potential (a ground potential for example) is applied to the drive electrode 12 which includes the arms 12A, 12B. The drive electrode 23 is provided within a separation distance L2 between these arms 12A, 12B as have been described. Hence, as a predetermined drive potential which is higher than the reference potential generates an electric field from the drive electrode 23 during device operation, the electric field is likely to be absorbed by the arms 12A, 12B of the drive electrode 12 (In other words, the electric field generated from the drive electrode 23 is not likely to leak out of the driving mechanism beyond the arms 12A, 12B). Therefore, the micro oscillating device X1 is suitable for reducing the electric field leakage out of the device during device operation. The micro oscillating device X1 as described is preferable in making a micro oscillating device array which has a high device density. In the micro oscillating device array, a plurality of the micro oscillating devices X1 may be laid in one-dimensional manner or two-dimensional manner.

According to the micro oscillating device X1, the drive electrode 12, the shielded electrode part 14 of the oscillating part 10, the shielded electrode parts 21a', 21b' (the first-layer piece 21a and the second-layer piece 21b) of the frame 21 and the shielded electrode part 24 are electrically connected with each other. Therefore, when the device is in operation, not only is the drive electrode 12 but also the shielded electrode parts 14, 21a', 21b', 24 are supplied with the reference potential (a ground potential for example). Therefore, as a predetermined drive potential which is higher than the reference potential generates an electric field from the drive electrode 23 to e.g. the land 11 when the device is in operation, the electric field is likely to be absorbed by the shielded electrode part 14 (In other words, the electric field is not likely to reach the land 11, for example, beyond the shielded electrode part 14). Likewise, the electric field generated from the drive electrode 23 when the device is in operation is likely to be absorbed by the shielded electrode part 21a' (In other words, the electric field is not likely to leak out of the device beyond the shielded electrode part 21a' of the frame 21). In addition, the electric field generated from the drive electrode 23 when the device is in operation is likely to be absorbed by the shielded electrode part 21b' (In other words, the electric field is not likely to leak out of the device beyond the shielded electrode part 21b' of the frame 21). Still further, an electric field generated from the electrode teeth 23a of the drive electrode 23 toward e.g. the arm 12B of the drive electrode 12 when the device is in operation, and an electric field generated from the electrode teeth 23b of the drive electrode 23 toward e.g. the arm 12A of the drive electrode 12 when the device is in operation are likely to be absorbed by the shielded electrode part 24. These effects of electric field absorption also help reducing the electric field leakage to outside of the device.

In addition, according to the micro oscillating device X1, the electrode teeth 12a, 12b of the drive electrode 12, which is one of the two drive electrodes in the driving mechanism, extend in parallel to the axis A1, whereas the electrode teeth 23a, 23b of the drive electrode 23, which is the other of the two drive electrodes, extend in parallel to the axis A1. Such an arrangement is preferable in efficient generation of the driving force necessary for the oscillating movement of the oscillating part 10 about the axis A1.

Figure 8:
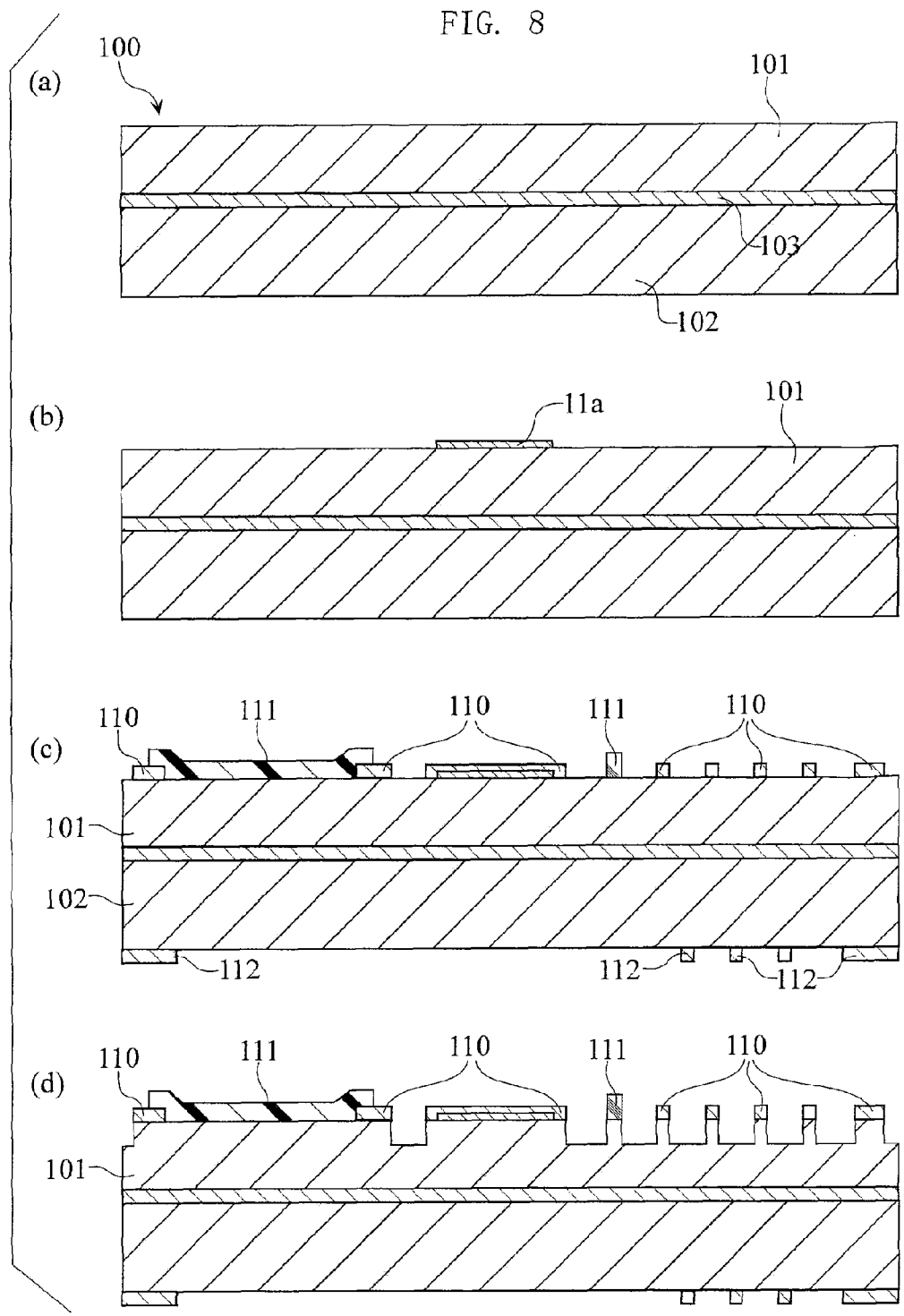
FIG. 8 shows a few steps in a method of making the micro oscillating device in FIG. 1.
Figure 9:
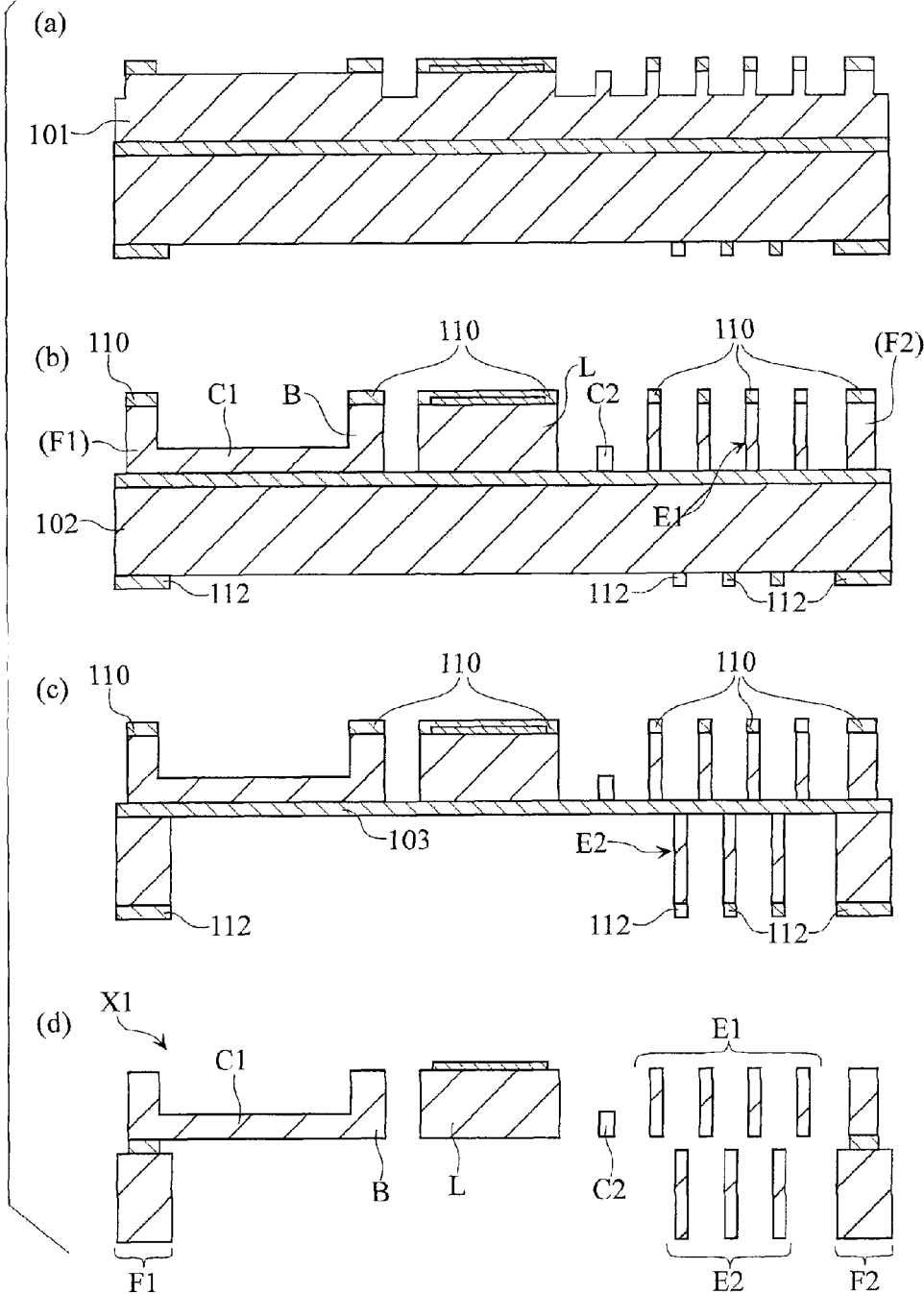
FIG. 9 shows steps which follow those in FIG. 8.

FIG. 8 and FIG. 9 show a method of making the micro oscillating device X1. The method is an example of how the micro oscillating device X1 can be manufactured through bulk micromachining technology. FIG. 8 and FIG. 9 show a section in a series, illustrating a formation process of various parts shown in FIG. 9(d), i.e. a land L, frames F1, F2, connecting parts C1, C2, and a set of electrodes E1, E2. The section is a conceptual composite of fragmentary sections collected from a plurality of sections of a material wafer (a wafer which has a laminate structure) to which a series of manufacturing operations are made to form a single micro oscillating device. The land L represents part of the land 11. The beam B represents the beam 13, and is shown as a cross-section of the beam 13. The frames F1, F2 each representing the frame 21, are shown as cross-sections of the frame 21. The connecting part C1, representing the connecting parts 22, is shown as a section taken in the direction in which the torsion bars 22a extends. The connecting part C2, representing the connecting parts 22, is shown as a cross-section of the torsion bar 22a. The electrode E1, representing part of the drive electrode 12, is shown as a cross-section of the electrode teeth 12a, 12b. The electrodes E2, representing part of the drive electrodes 23, is shown as a cross-section of the electrode teeth 23a, 23b.

In the manufacture of the micro oscillating device X1, first, a material substrate 100 as shown in FIG. 8(a) is prepared. The material substrate 100 is an SOI wafer which has a laminate structure including silicon layers 101, 102, and an insulation layer 103 between the silicon layers 101, 102. Though not illustrated in the figure, electrically conductive vias 16, 21d are already formed. The silicon layers 101, 102 are made of an electrically conductive silicon material doped with impurity. The impurity may be a p-type impurity such as boron, or an n-type impurity such as phosphorus and antimony. The insulation layer 103 is made of oxide silicon for example. The silicon layer 101 has a thickness of e.g. 10 through 100 μm, the silicon layer 102 has a thickness of e.g. 50 through 500 μm, and the insulation layer 103 has a thickness of e.g. 0.3 through 3 μm.

Next, as shown in FIG. 8(b), a mirror surface 11a is formed on the silicon layer 101. Specifically, when forming the mirror surface 11a, first, a film of Cr (50 nm) for example, and then a film of Au (200 nm) for example are formed by spattering on the silicon layer 101. Next, these metal films are etched sequentially via a predetermined mask, to pattern the mirror surface 11a. The etchant for Au may be aqueous potassium iodide-iodine solution. The etchant for Cr may be aqueous cerium ammonium nitrate solution.

Figure 10:
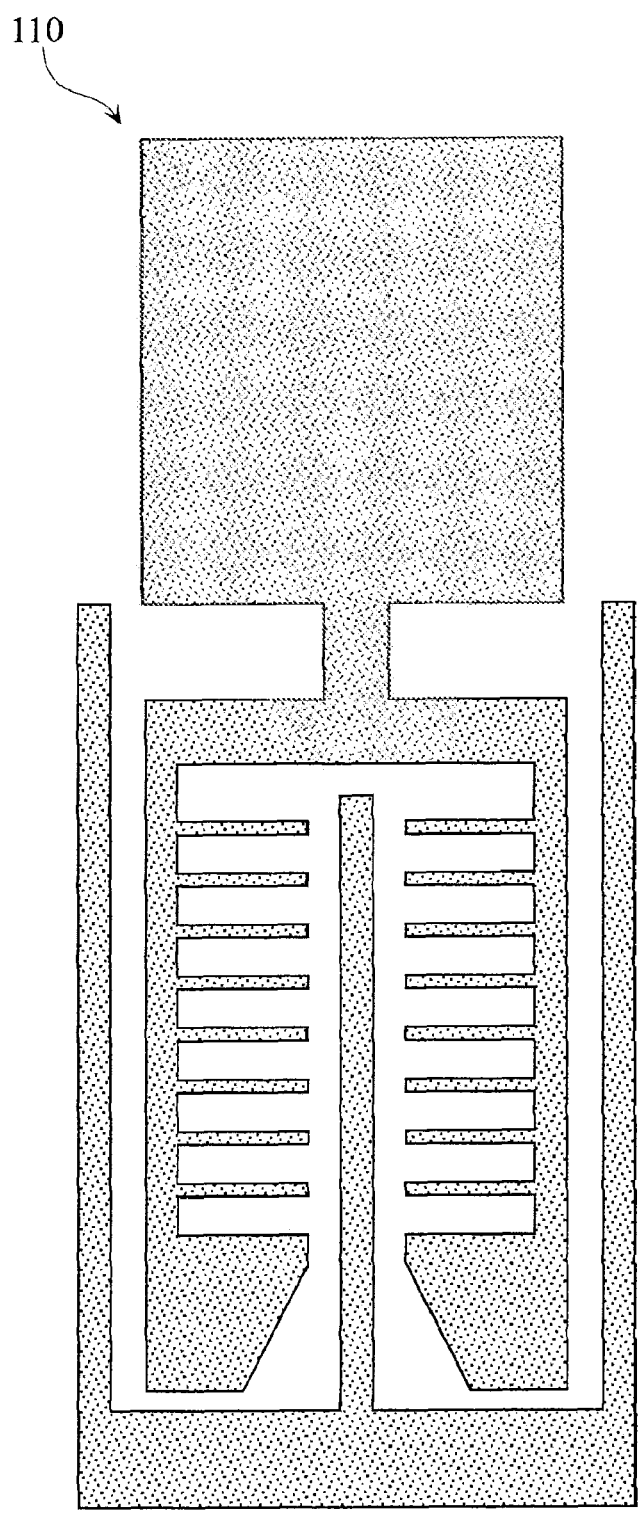
FIG. 10 is a plan view of a mask pattern.
Figure 11:
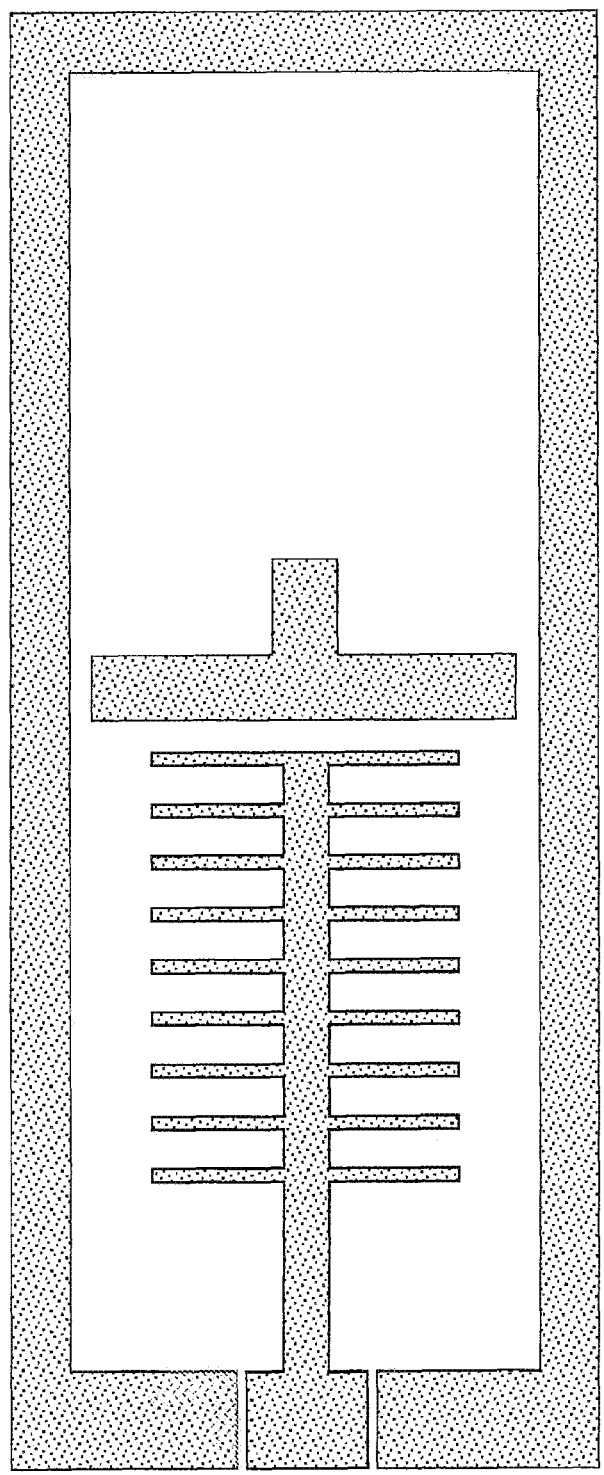
FIG. 11 is a plan view of another mask pattern.

Next, as shown in FIG. 8(c), an oxide film pattern 110 and a resist pattern 111 are formed on the silicon layer 101, and an oxide film pattern 112 is formed on the silicon layer 102. The oxide film pattern 110 has a pattern shown in FIG. 10, for forming the oscillating part 10 (including the land L, the beam B, and the electrode E1), part of the frame 21 (including the frames F1, F2), and the shielded electrode part 24 which are to be formed on the silicon layer 101. The resist pattern 111 has a pattern for forming the connecting parts 22 (including the connecting parts C1, C2). The oxide film pattern 112 has a pattern shown in FIG. 11 for forming part of the frame 21 (including the frames F1, F2), the drive electrode 23 (including the electrode E2) and the shielded electrode part 14.

Next, as shown in FIG. 8(d), etching by DRIE (Deep Reactive Ion Etching) is performed to the silicon layer 101 to a predetermined depth, using masks provided by the oxide film pattern 110 and the resist pattern 111. The predetermined depth is a depth equal to the thickness of the connecting parts C1, C2, being 5 μm for example. In the DRIE step, good anisotropic etching can be performed if a Bosch process is employed in which etching by using $SF_6$ gas and side-wall protection by using $C_4F_8$ gas are alternated with each other. The DRIE in this step and those described later may be performed by using the Bosch process.

Next, as shown in FIG. 9(a), the resist pattern 111 is removed. The removal of the resist pattern 111 may be achieved with a remover.

Next, as shown in FIG. 9(b), using the oxide film pattern 110 as a mask, etching by DRIE is performed to the silicon layer 101 until the insulation layer 103 is reached, to form the connecting parts C1, C2. This etching process yields the oscillating part 10 (including the land L, the beam B and the electrode E1), part of the frame 21 (including the frames F1, F2) (the first-layer piece 21a), each of the connecting parts 22 (including the connecting parts C1, C2), and the shielded electrode part 24.

Next, as shown in FIG. 9(c), using the oxide film pattern 112 as a mask, etching by DRIE is performed to the silicon layer 102 until the insulation layer 103 is reached. This etching process yields part of the frame 21 (including the frame F1, F2) (the second-layer piece 21b), the drive electrode 23 (including the electrode E2) and the shielded electrode part 14.

Next, as shown in FIG. 9(d), exposed portions of the insulation layer 103 and the oxide film patterns 110, 112 are etched off. The etching may be dry etching or wet etching. If dry etching is used, examples of usable etching gas include $CF_4$ and $CHF_3$. If wet etching is used, the etchant to be used in this process may be buffered hydrofluoric acid (BHF) which contains hydrofluoric acid and ammonium fluoride.

By performing the above-described sequence of steps, it is possible to form the land L, the frames F1, F2, the connecting parts C1, C2, and a set of the electrodes E1, E2, and thereby to manufacture a micro oscillating device X1.

Figure 12:
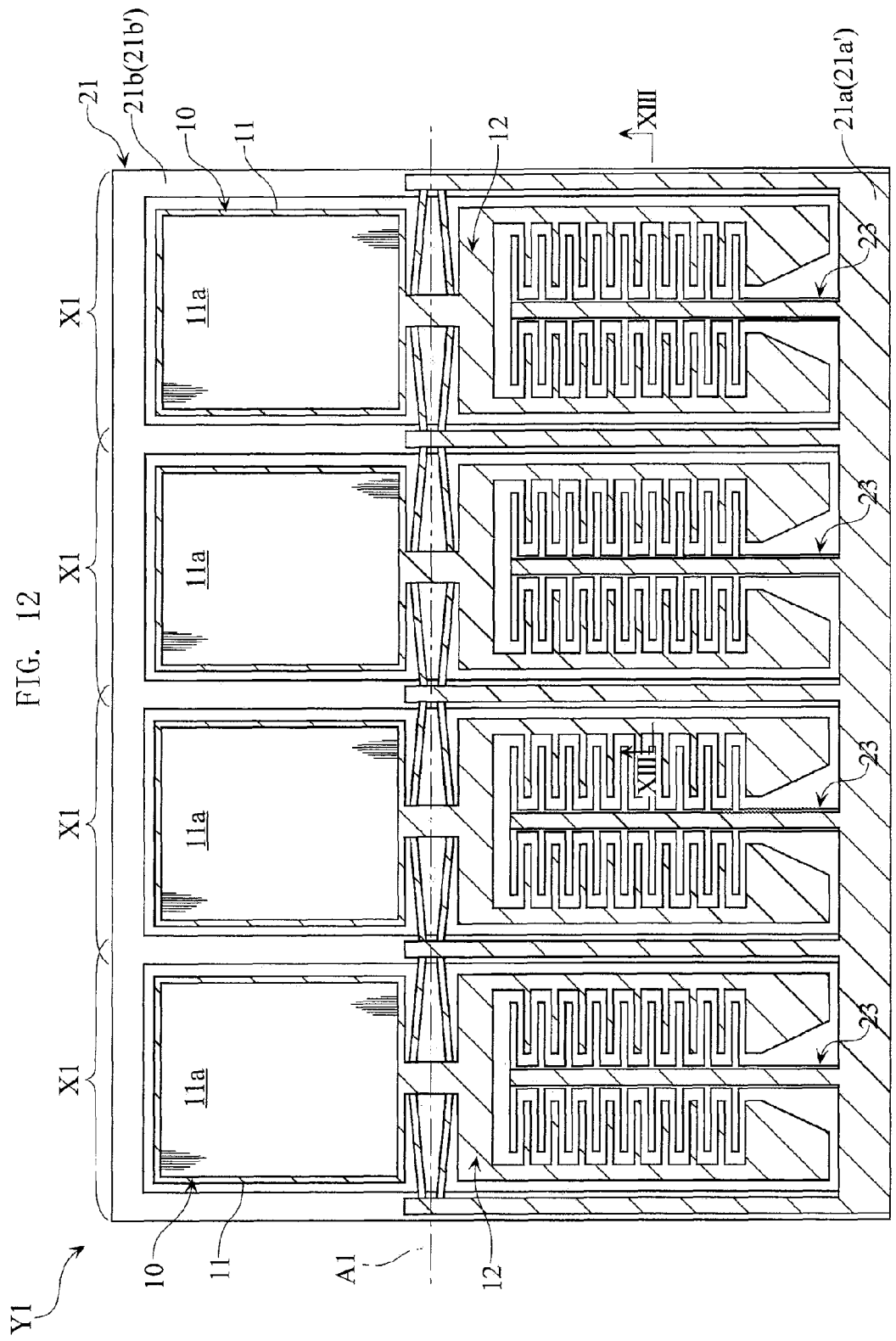
FIG. 12 shows a micro oscillating device array according to a second embodiment of the present invention.
Figure 13:
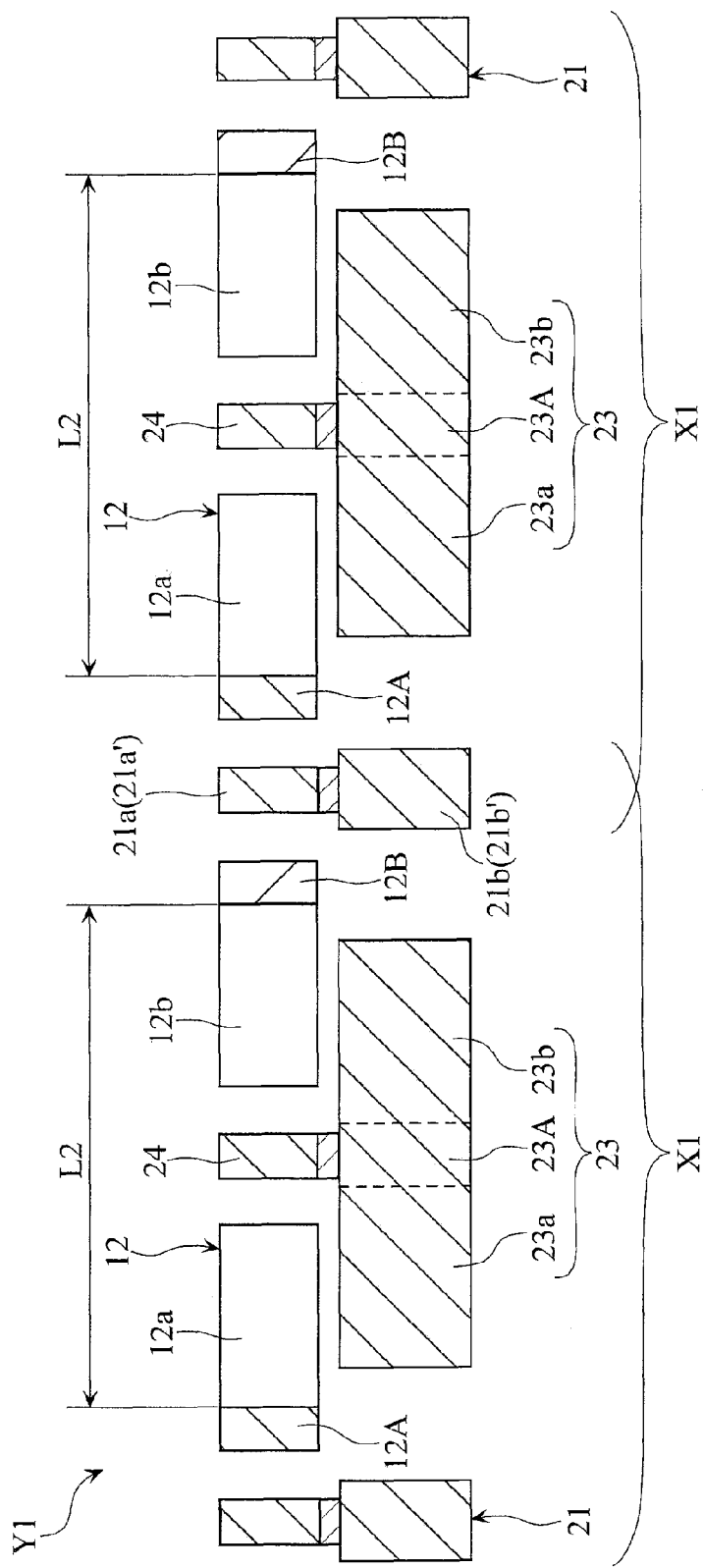
FIG. 13 is an enlarged partial sectional view taken along lines XIII-XIII in FIG. 12.

FIG. 12 shows a micro oscillating device array Y1 according to a second embodiment of the present invention. FIG. 13 is a partial sectional view of the micro oscillating device array Y1 taken along lines XIII-XIII in FIG. 12.

The micro oscillating device array Y1 includes a plurality (four in the present embodiment) of the micro oscillating device X1. In the micro oscillating device array Y1, the micro oscillating devices X1 are laid in line (in other words, in one-dimensional manner) in the direction of the axis A1. Therefore, in the micro oscillating device array Y1, the mirror surfaces 11a lie in line, in the direction of the axis A1.

In the micro oscillating device array Y1, the first-layer piece 21a of the frame 21 is continuous throughout all of the micro oscillating devices X1, and therefore, all of the drive electrodes 12, the shielded electrode parts 14 of the oscillating parts 10, the shielded electrode parts 21a', 21b' (the first-layer pieces 21a and the second-layer pieces 21b) of the frames 21, and the shielded electrode parts 24 in the micro oscillating devices X1 are electrically connected with each other.

When the micro oscillating device array Y1 is operated, a predetermined reference potential is applied commonly to the drive electrode 12 of the oscillating part 10 in all of the micro oscillating devices X1, and under this state, a predetermined potential is applied to the drive electrode 23 of selected ones of the micro oscillating devices X1. Thus, the oscillating part 10 in each micro oscillating device X1, i.e. the land 11 in the selected ones of the micro oscillating devices X1, are driven individually, making it possible to change light reflection directions of the mirror surface 11a formed on the land 11 in each of the micro oscillating device X1. Each micro oscillating device X1 is driven as described specifically in relation with the first embodiment.

As has been described in relation with the first embodiment, in each micro oscillating device X1, the drive electrode 23 is provided within the separation distance L2, i.e. within a distance between the arms 12A, 12B which constitute the outermost parts in the direction of extension of the axis A1 in the structure of the driving mechanism (drive electrodes 12, 23) and are supplied with the reference potential (a ground potential for example). Therefore, as a predetermined drive potential which is higher than the reference potential causes the drive electrode 23 to generate an electric field when the device is in operation, the electric field is likely to be absorbed by the arms 12A, 12B of this drive electrode 12, and hence, leakage of the electric field to outside of the device is reduced. Therefore, according to the micro oscillating device array Y1, the problem of electric field leakage, i.e. that electric field leakage from the driving mechanism (drive electrodes 12, 23) in one of the micro oscillating devices X1 can cause undue adverse affect to the operation characteristic of the adjacent micro oscillating devices X1, is reduced. The micro oscillating device array Y1 as described above is suitable for achieving a small mounting pitch between a plurality of the micro oscillating devices X1, and therefore between a plurality of the mirror surfaces 11a. In other words, the micro oscillating device array Y1 is suitable in increasing device density of the micro oscillating device X1, i.e. of the mirror surfaces 11a.

As has been described in relation with the first embodiment, in each micro oscillating device X1, not only the arms 12A, 12B of the drive electrode 12 but also the shielded electrode parts 14, 21a', 21b', 24 are capable of absorbing electric field. The effect of electric field absorption by each of the shielded electrode parts 14, 21a', 21b', 24 also helps reducing the problem of electric field leakage, i.e. that electric field leakage from the driving mechanism (drive electrodes 12, 23) in one of the micro oscillating devices X1 can cause undue adverse affect to the operation characteristic of the adjacent micro oscillating devices X1.

Figure 14:
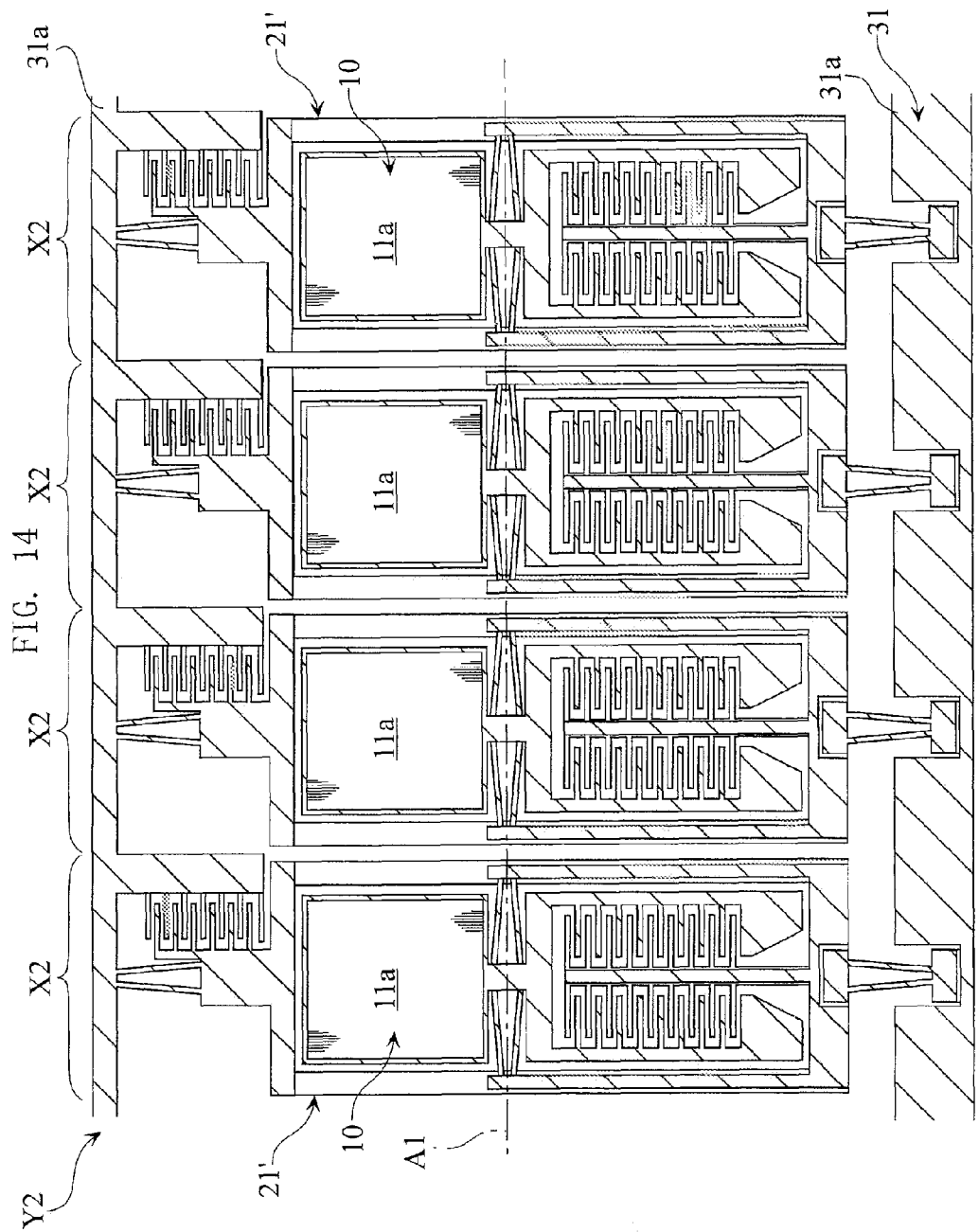
FIG. 14 is a partial plan view of a micro oscillating device array according to a third embodiment of the present invention.

FIG. 14 is a partial plan view of a micro oscillating device array Y2 according to a third embodiment of the present invention. The micro oscillating device array Y2 includes a plurality of micro oscillating devices X2. In the micro oscillating device array Y2, these micro oscillating devices X2 are laid in line (in other words, in one-dimensional manner).

Figure 15:
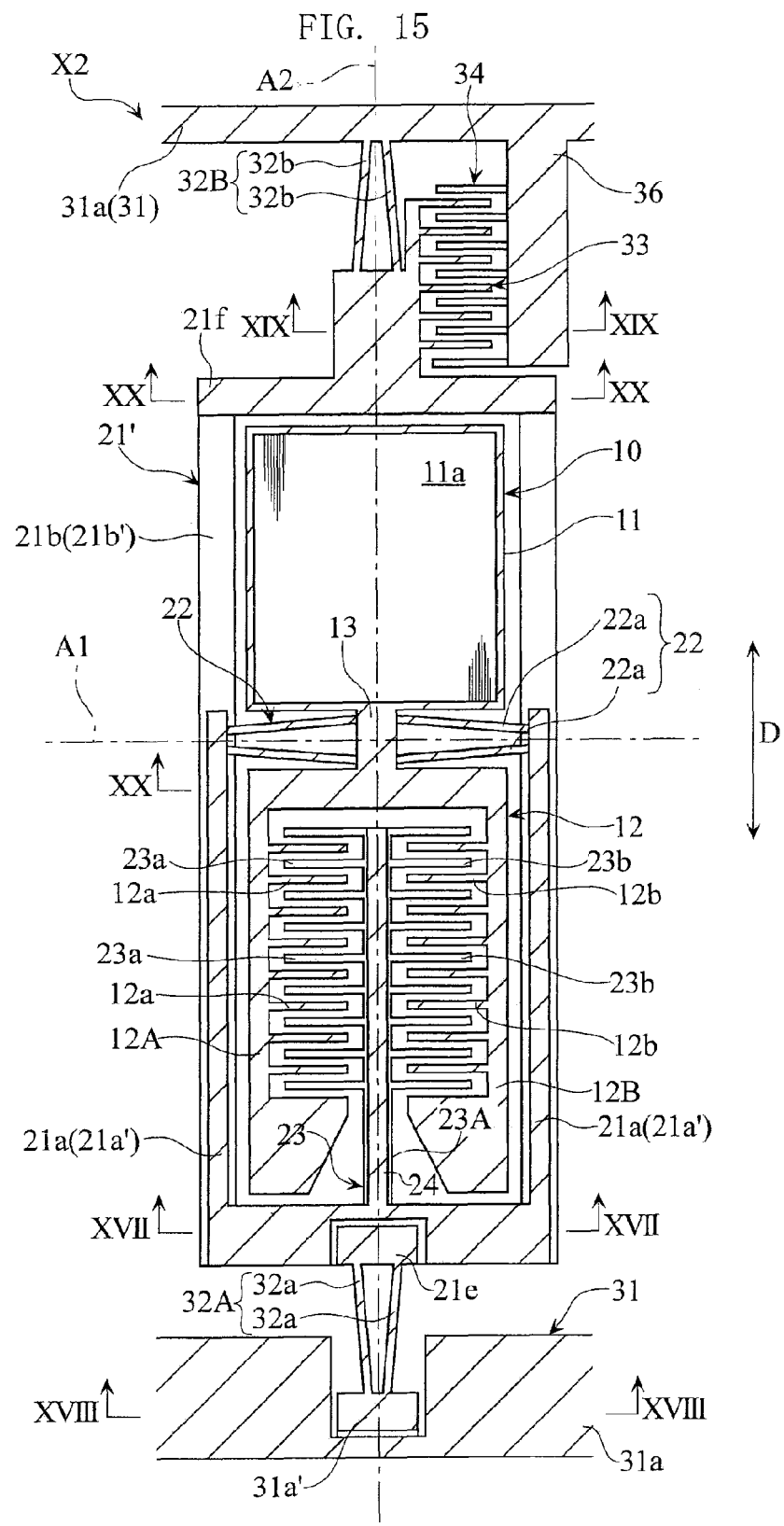
FIG. 15 is a plan view of a micro oscillating device included in the micro oscillating device array in FIG. 14.
Figure 16:
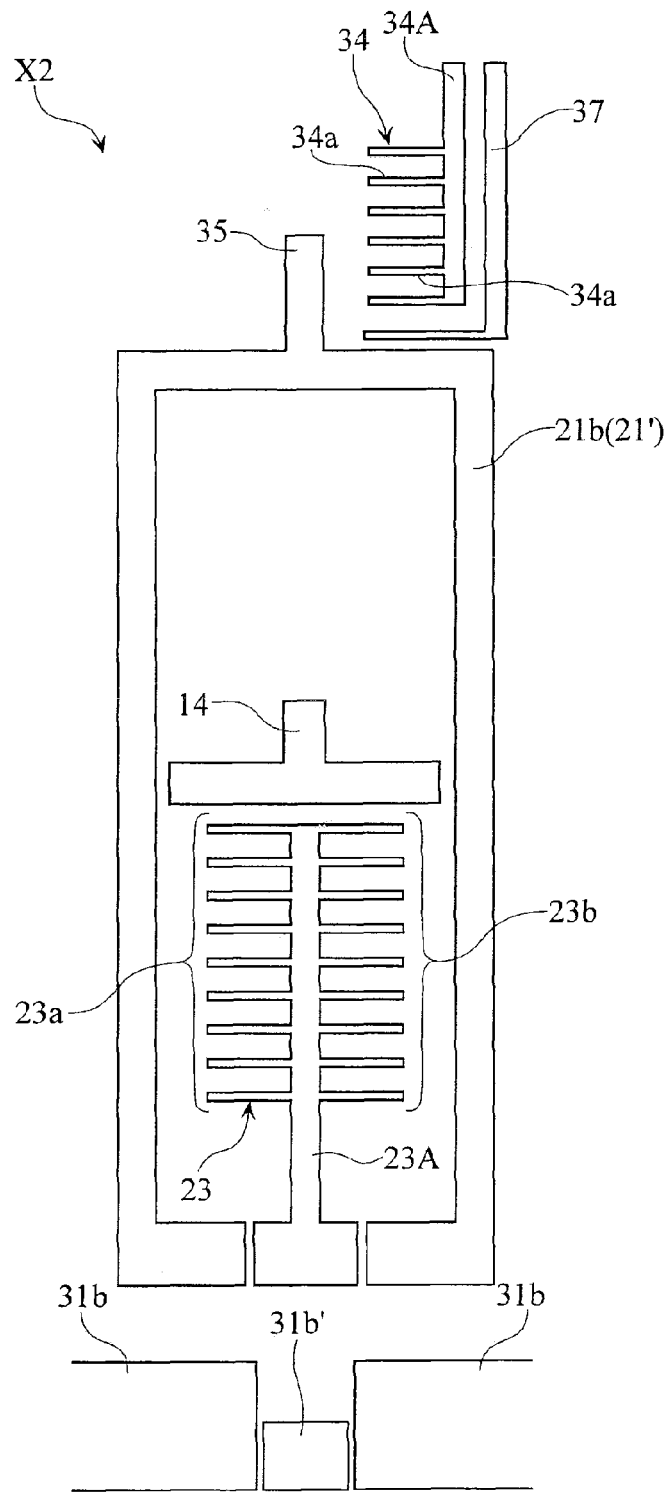
FIG. 16 is a partially unillustrated plan view of the micro oscillating device in FIG. 15.

FIG. 15 through FIG. 20 show the micro oscillating device X2 which is included in the micro oscillating device array Y2. FIG. 15 is a plan view of the micro oscillating device X2, and FIG. 16 is a partially unillustrated plan view of the micro oscillating device X2. FIG. 17 through FIG. 20 are sectional views taken along lines XVII-XVII, XVIII-XVIII, XIX-XIX, and XX-XX in FIG. 15 respectively.

The micro oscillating device X2 includes an oscillating part 10, a frame 21', a pair of connecting parts 22, a drive electrode 23, a shielded electrode part 24, a frame 31, a pair of connecting parts 32A, 32B, drive electrodes 33, 34, and shielded electrode parts 35, 36, 37. In the present embodiment, the device is a micromirror device. The micro oscillating device X2 is manufactured by bulk micromachining technology such as MEMS technology, from a material substrate provided by an SOI wafer. The material substrate has a laminate structure constituted by a first and a second silicon layers and an insulation layer between the silicon layers. Each silicon layer has a predetermined electrical conductivity through doping with impurity. The above-mentioned parts in the micro oscillating device X2 are primarily formed in the first silicon layer and/or the second silicon layer. For the sake of illustrative clarity, hatching is provided in FIG. 15 on those parts which are formed in the first silicon layer and are higher than the insulation layer toward the viewer of the figure. In FIG. 16, the structure shown is formed in the second silicon layer in the micro oscillating device X2.

The micro oscillating device X2 differs from the micro oscillating device X1 provided by the first embodiment in that the frame 21 is replaced by the frame 21', and that the device further includes the frame 31, the connecting parts 32A, 32B, the drive electrodes 33, 34, and the shielded electrode parts 35, 36, 37. The oscillating part 10, the pair of connecting parts 22, the drive electrode 23 and the shielded electrode part 24 in the micro oscillating device X2 are essentially the same as the oscillating part 10, the pair of connecting parts 22, the drive electrode 23, and the shielded electrode part 24 in the micro oscillating device X1.

Figure 17:
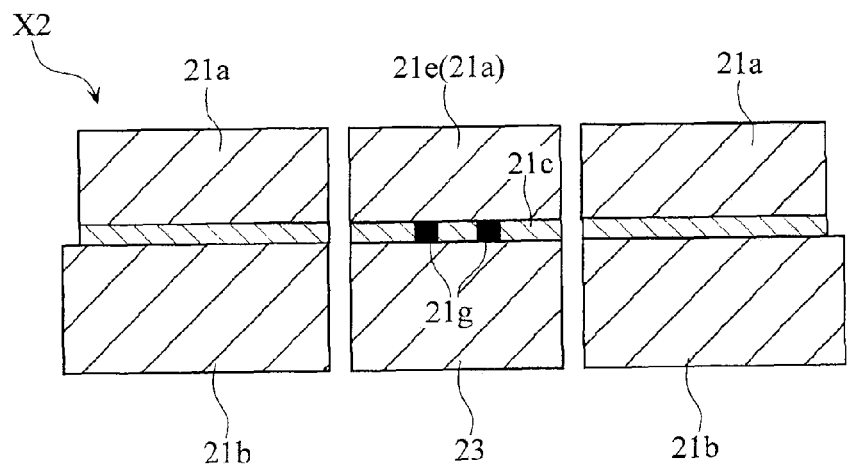
FIG. 17 is an enlarged sectional view taken along lines XVII-XVII in FIG. 15.
Figure 20:
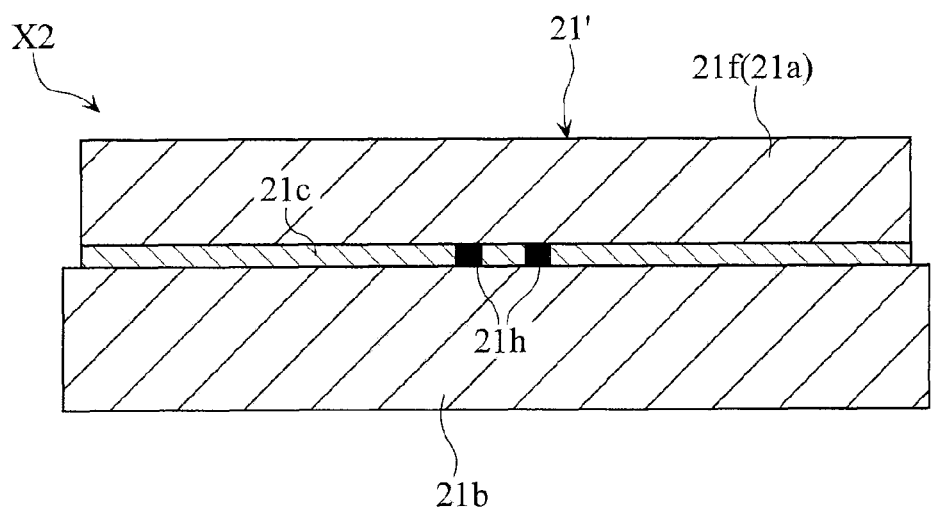
FIG. 20 is an enlarged sectional view taken along lines XX-XX in FIG. 15.

The frame 21' differs from the frame 21 in that the first-layer piece 21a has parts 21e, 21f. As shown in FIG. 15 and FIG. 17, the part 21e is separated in the first-layer piece 21a, from its surroundings by a gap. The part 21e is electrically connected with the arm 23A of the drive electrode 23 via electrically conductive vias 21g which penetrate the insulation layer 21c. As shown in FIG. 15, the part 21f is provided at an end of the frame 21, and has a part extending in a direction indicated by Arrow D in FIG. 15. Further, as shown in FIG. 20, the part 21f is electrically connected with the second-layer piece 21b via electrically conductive vias 21h which penetrate the insulation layer 21c.

Figure 18:
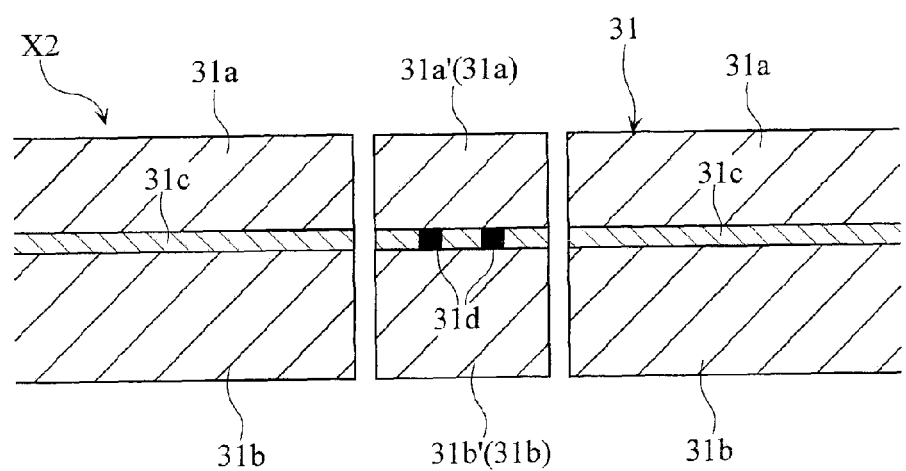
FIG. 18 is an enlarged sectional view taken along lines XVIII-XVIII in FIG. 15.

As shown in FIG. 18, the frame 31 has a laminate structure including a first-layer piece 31a formed in the first silicon layer, a second-layer piece 31b formed in the second silicon layer and an insulation layer 31c between the first and the second layer-pieces 31a, 31b. As shown in FIG. 15 and FIG. 18, the first-layer piece 31a includes a part 31a' which is separated from its surrounds via a gap. As shown in FIG. 16 and FIG. 18, the second-layer piece 31b includes a part 31b' which is separated from its surrounds by a gap. The parts 31a', 31b' are electrically connected with each other by electrically conductive vias 31d which penetrate the insulation layer 31c.

As shown in FIG. 15, the connecting part 32A is provided by two torsion bars 32a. Each torsion bar 32a is a part formed in the first silicon layer, and connects with the part 21e of the first-layer piece 21a in the frame 21' as well as with the part 31a' of the first-layer piece 31a in the frame 31, thereby connecting the frames 21', 32. The torsion bars 32a provide electrical connection between the parts 21e, 31a'. The two torsion bars 32a are spaced from each other by a gap, which gradually increases from the frame 31 toward the frame 21'. Like the torsion bars 22a of the connecting parts 22 in the first embodiment, the torsion bars 32a are thin parts.

As shown in FIG. 15, the connecting part 32B is provided by two torsion bars 32b. Each torsion bar 32b is a part formed in the first silicon layer, and connects with the part 21f of the first-layer piece 21a in the frame 21' as well as with the first-layer piece 31a in the frame 31, thereby connecting the frames 21', 31. The torsion bars 32b provide electrical connection between the part 21f and part of the first-layer piece 31a. The two torsion bars 32b are spaced from each other by a gap, which gradually increases from the frame 31 toward the frame 21'. Like the torsion bars 22a of the connecting parts 22 in the first embodiment, the torsion bars 32b are thin parts.

The pair of connecting parts 32A, 32B defines an axis A2 of oscillating motion of the frame 21'. The axis A2 extends in the direction indicated by Arrow D in FIG. 15. The connecting part 32A which includes two torsion bars 32a whose gap in between increases gradually from the frame 31 toward the frame 21', as well as the connecting part 32B which includes two torsion bars 32b whose gap in between increases gradually toward the frame 21' are suitable for reduced generation of displacement components which are unnecessary for the oscillating motion of the frame 21'.

The drive electrode 33 is a part formed in the first silicon layer, and is constituted by a plurality of electrode teeth 33a. The electrode teeth 33a extend from the part 21f in the frame 21' toward the drive electrode 34 in parallel to each other at a space provided in the direction in which the axis A2 extends.

The drive electrode 34 is a part formed in the second silicon layer, and is constituted by an arm 34A and a plurality of electrode teeth 34a. The arm 34A extends in the direction in which the axis A2 extends. The electrode teeth 34a extend from the arm 34A toward the drive electrode 33 in parallel to each other at a space provided in the direction in which the arm 34A extends.

Figure 19:
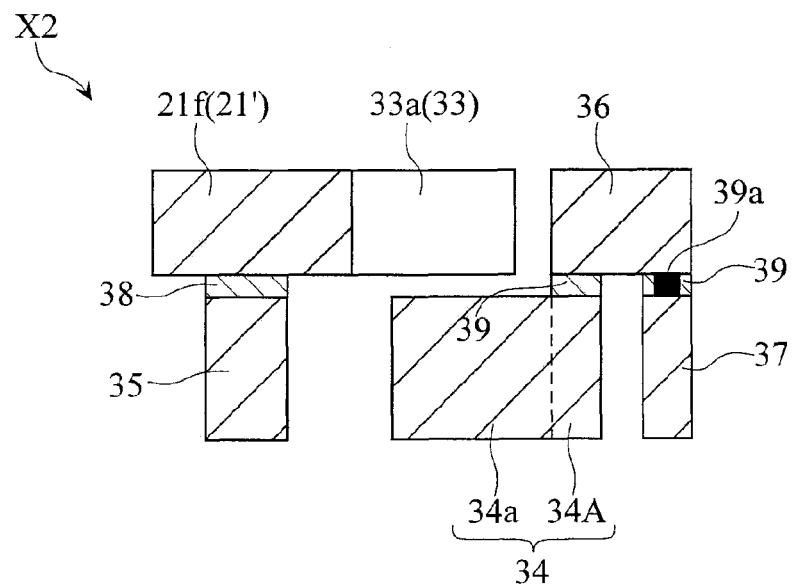
FIG. 19 is an enlarged sectional view taken along lines XIX-XIX in FIG. 15.

As shown clearly in FIG. 16, the shielded electrode part 35 is a part formed in the second silicon layer, and is continuous to part of the second-layer piece 21b in the frame 21'. Further, as shown in FIG. 19, the shielded electrode part 35 is bonded to the part 21f in the frame 21' via the insulation layer 38. As shown clearly in FIG. 15, the shielded electrode part 36 is a part formed in the first silicon layer, and is continuous to part of the first-layer piece 31a in the frame 31. Further, as shown in FIG. 19, the shielded electrode part 36 is bonded to the drive electrode 34 via the insulation layer 39. The shielded electrode 36 and the drive electrode 34 are electrically separated from each other.

As shown clearly in FIG. 16, the shielded electrode part 37 is a part formed in the second silicon layer, and extends along the drive electrode 34. Further, as shown in FIG. 19, the shielded electrode part 37 is bonded to the shielded electrode part 36 via the insulation layer 39, and electrically connected therewith via electrically conductive via 39a which penetrates the insulation layer 39.

In the micro oscillating device X2, a pair of drive electrodes 12, 23, constitutes a driving mechanism, i.e. an actuator, for generation of a driving force necessary to move the oscillating part 10. Also, a pair of drive electrodes 33, 34, constitutes a driving mechanism, i.e. an actuator, for generation of a driving force necessary to move the frame 21'.

When operating the micro oscillating device X2, a predetermined reference potential is applied to the drive electrode 12 of the oscillating part 10 and the drive electrode 33. The application of reference potential to the drive electrode 12 can be achieved via part of the first-layer piece 31a in the frame 31, the torsion bars 32b of the connecting part 32B, the part 21f of the first-layer piece 21a in the frame 21', the vias 21h, the second-layer piece 21b in the frame 21', the vias 21d (shown in FIG. 6), part of the first-layer piece 21a in the frame 21', the torsion bars 22a of the connecting parts 22, and the beam 13 of the oscillating part 10. The application of reference potential to the drive electrode 33 can be achieved via part of the first-layer piece 31a in the frame 31, the torsion bars 32b of the connecting part 32B, and the part 21f of the first-layer piece 21a in the frame 21'. The reference potential is a ground potential for example, and preferably, maintained at a constant level.

With the above arrangement, it is possible in the micro oscillating device X2 to apply a drive potential which is higher than the reference potential to each of the drive electrodes 23, 34 as necessary, to generate an electrostatic attraction between the drive electrodes 12, 23 to pivot the oscillating part 10 about the axis A1. Likewise, it is possible to generate an electrostatic attraction between the drive electrodes 33, 34, to pivot the frame 21' and the oscillating part 10 therewith, about the axis A2. In other words, the micro oscillating device X2 is a dual-axis oscillating device. The application of drive potential to the drive electrode 23 can be achieved via the part 31b' of the second-layer piece 31b in the frame 31', the via 31d, the part 31a' of the first-layer piece 31a in the frame 31, the torsion bars 32a of the connecting part 32A, the part 21e of the first-layer piece 21a in the frame 21', and the vias 21g. Through such a dual-axis oscillating movement, it is possible to change light reflection directions of the light reflected by the mirror surface 11a provided on the land 11.

According to the micro oscillating device X2 which has virtually all the arrangements provided in the micro oscillating device X1 offered by the first embodiment, leakage of the electric field from the drive electrode 23 to outside of the device during device operation is reduced, just as described earlier in relation with the first embodiment.

In addition, according to the micro oscillating device X2, leakage of the electric field from the drive electrode 34 to the outside of the device during device operation is also reduced. In the micro oscillating device X2, the drive electrode 33 and the shielded electrode parts 35, 36, 37 are electrically connected with each other and thus, not only is the drive electrode 33 but also the shielded electrode parts 35, 36, 37 are supplied with the reference potential (a ground potential for example) when the device is in operation. Therefore, as a predetermined drive potential which is higher than the reference potential generates an electric field from the drive electrode 34 toward e.g. the drive electrode 33 when the device is in operation, the electric field is likely to be absorbed by the shielded electrode part 35 as well as by the drive electrode 33 (In other words, the electric field is not likely to go beyond the drive electrode 33 and the shielded electrode part 35). Likewise, there is an electric field generated from the drive electrode 34 toward the side away from the drive electrode 33 during device operation. This electric field is likely to be absorbed by the shielded electrode parts 36, 37 (In other words, the electric field is not likely to leak beyond the shielded electrode parts 36, 37). These effects of electric field absorption also help reducing electric field leakage to outside of the device.

The micro oscillating device array Y2 includes a plurality of the above-described micro oscillating devices X2. In the micro oscillating device array Y2, all of these micro oscillating devices X2 are laid in a single array so that all of their axes A2 (not illustrated in FIG. 14) are parallel to each other.

In the micro oscillating device array Y2, the first-layer piece 31a of the frame 31 is continuous throughout all of the micro oscillating devices X2 except for the parts 31a'. Therefore, all of the drive electrodes 12, the shielded electrode parts 14 of the oscillating parts 10, parts of the first-layer pieces 21a of the frames 21 (shielded electrode parts 21a'), parts of the second-layer pieces 21b (shielded electrode parts 21b'), and the shielded electrode parts 24 in the micro oscillating devices X2 are electrically connected with each other.

When the micro oscillating device array Y2 is operated, a predetermined reference potential is applied commonly to the drive electrode 12 of the oscillating part 10 in all of the micro oscillating devices X2, and under this state, a predetermined potential is applied to the drive electrodes 23, 34 of selected ones of the micro oscillating devices X2. Thus, the oscillating part 10 and the frame 21' in each micro oscillating device X2 are driven individually, making it possible to change light reflection directions of the mirror surface 11*a* formed on the land 11 in each of the micro oscillating device X2.

As has been described, in each micro oscillating device X2, leakage of the electric field generated from the electrode 23 to outside of the device when the device is in operation is reduced. Therefore, in the micro oscillating device array Y2, the problem of electric field leakage, i.e. that electric field leakage from the driving mechanism (the drive electrodes 12, 23) in one of the micro oscillating devices X2 can cause undue adverse affect to the operation characteristic of the adjacent micro oscillating devices X2, is reduced. In addition, in each micro device X2, electric field leakage from the electrode 34 to outside of the device during device operation is reduced. Therefore, according to the micro oscillating device array Y2, there is a decrease in the problem that electric field leakage from the driving mechanism (drive electrodes 33, 34) in one of the micro oscillating devices X2 causes undue adverse affect to the operation characteristic of adjacent micro oscillating devices X2. The micro oscillating device array Y2 as described above is suitable for achieving a small mounting pitch between a plurality of dual-shaft type micro oscillating devices X2, and therefore between a plurality of the mirror surfaces 11*a*. In other words, the micro oscillating device array Y2 is suitable in increasing device density of the micro oscillating device X2, i.e. the mirror surface 11*a*.

Figure 21:
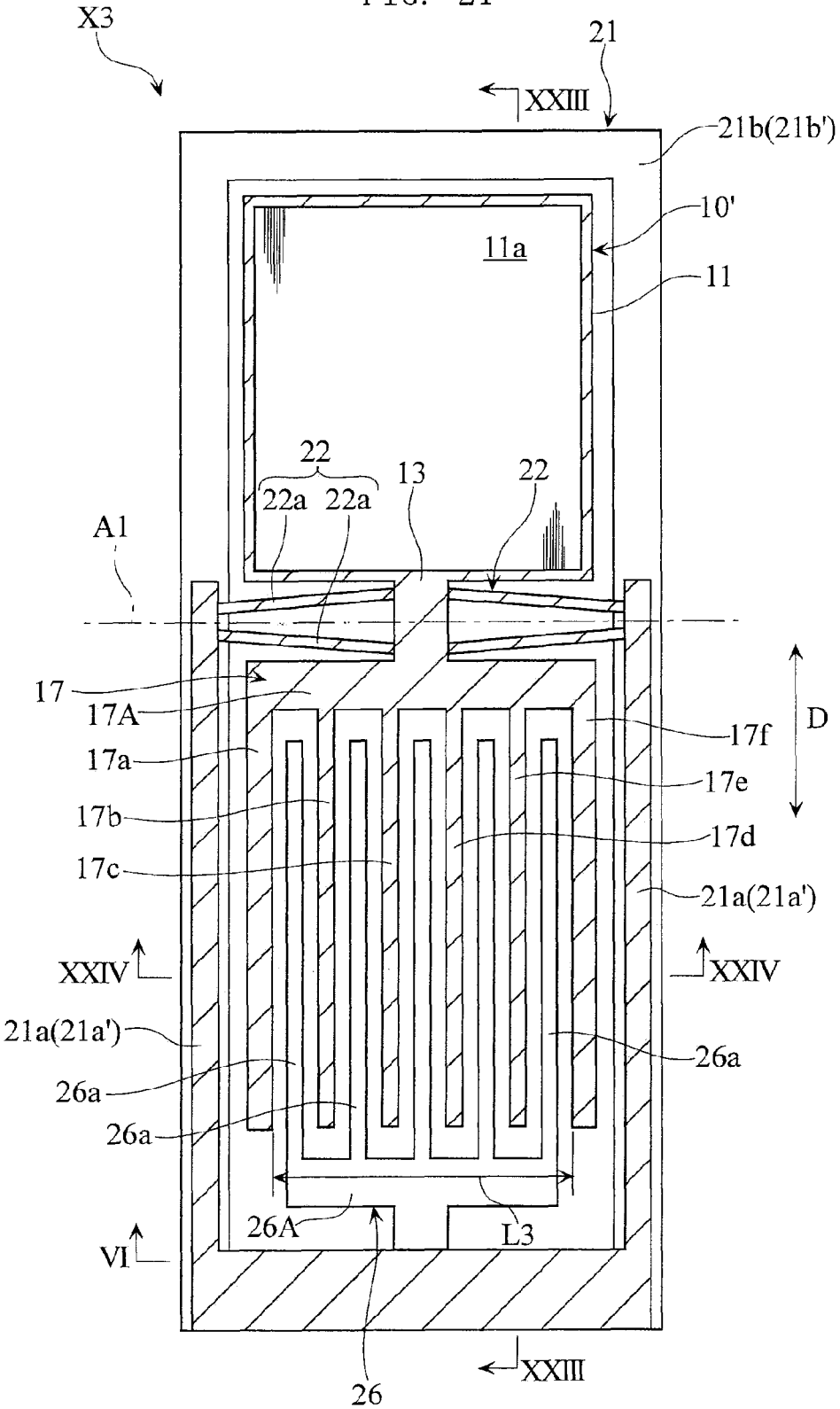
FIG. 21 is a plan view of a micro oscillating device according to a fourth embodiment of the present invention.
Figure 22:
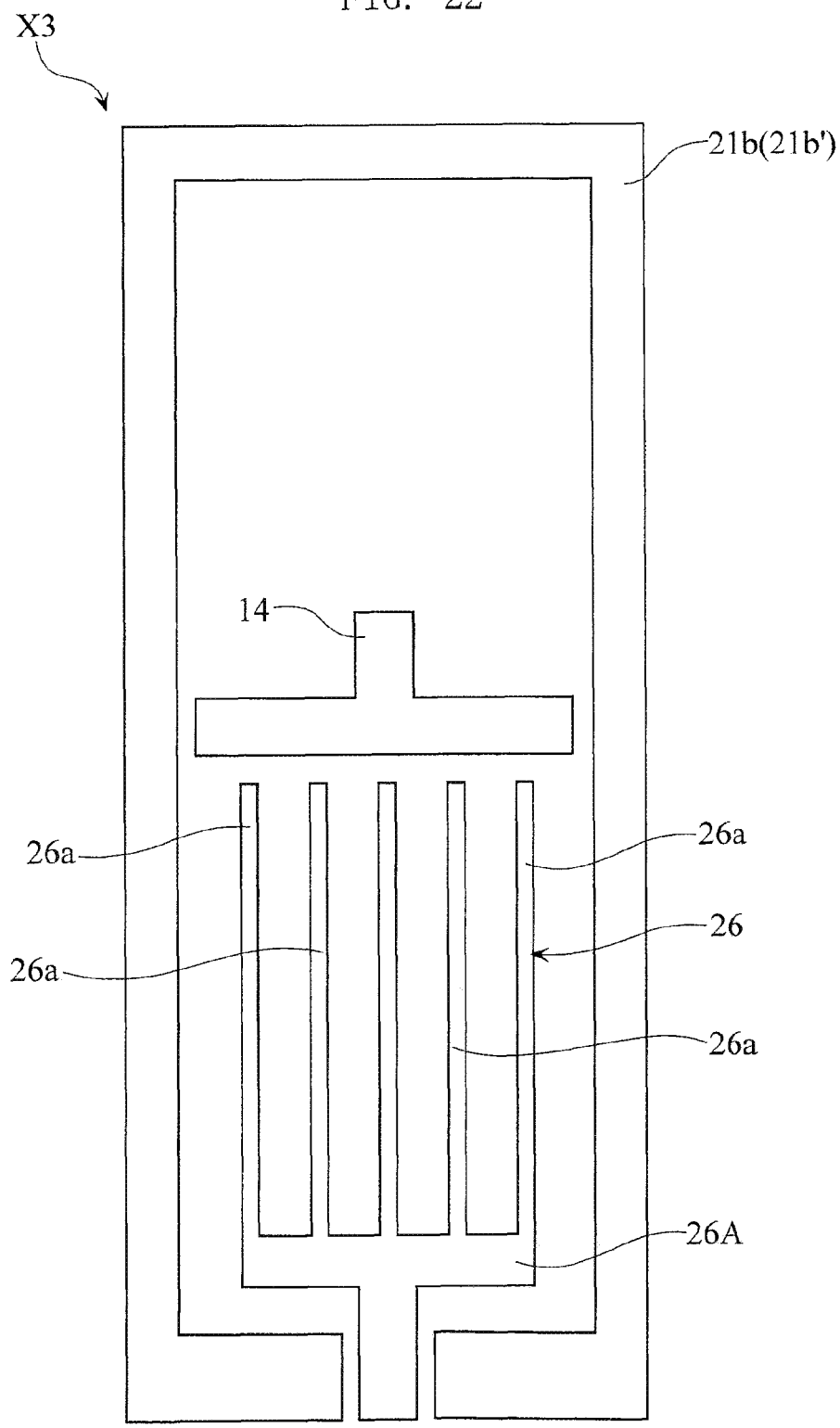
FIG. 22 is a partially unillustrated plan view of the micro oscillating device in FIG. 21.
Figure 23:
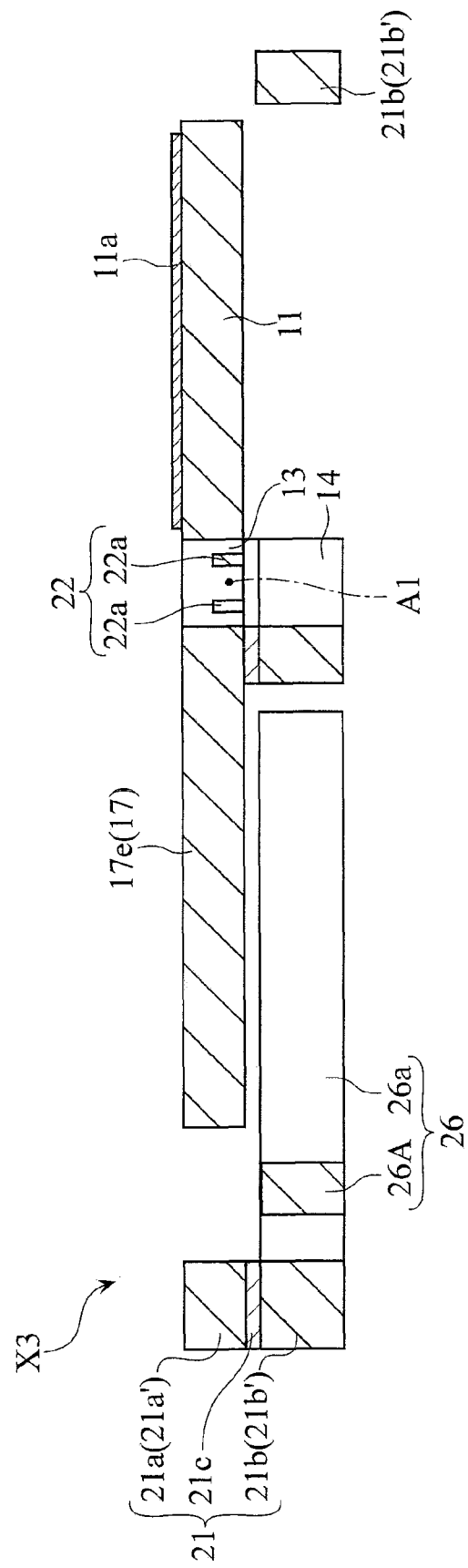
FIG. 23 is a sectional view taken along lines XXIII-XXIII in FIG. 21.
Figure 24:
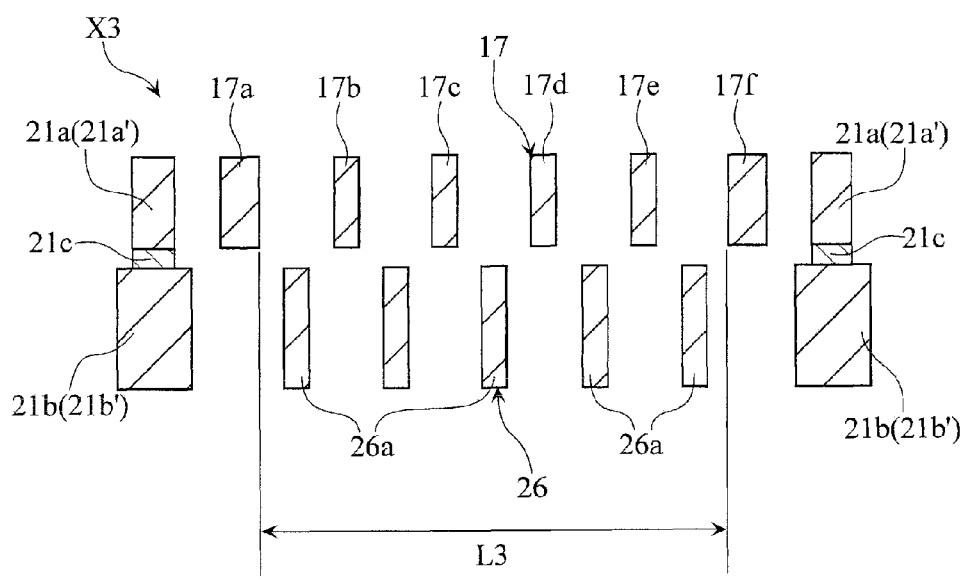
FIG. 24 is an enlarged sectional view taken along lines XXIV-XXIV in FIG. 21.
Figure 25:
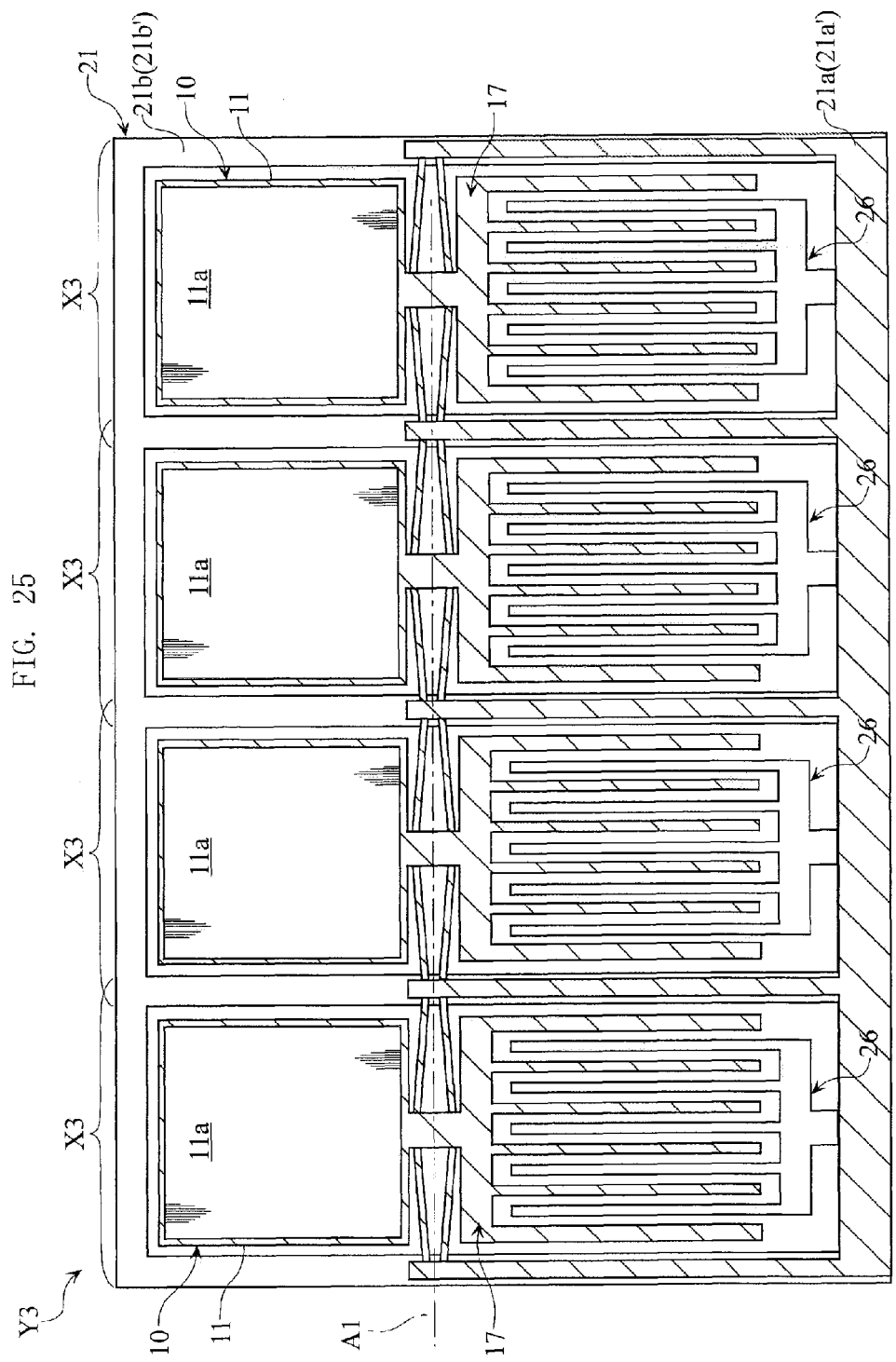
FIG. 25 shows a micro oscillating device array according to a fifth embodiment of the present invention.

FIG. 21 through FIG. 24 show a micro oscillating device X3 according to a fourth embodiment of the present invention. FIG. 21 is a plan view of the micro oscillating device X3, and FIG. 22 is a partially unillustrated plan view of the micro oscillating device X3. FIG. 23 and FIG. 24 are sectional views taken along lines XXIII-XXIII and XXIV-XXIV in FIG. 23.

The micro oscillating device X3 includes an oscillating part 10', a frame 21, a pair of connecting parts 22, and a drive electrode 26. In the present embodiment, the device is a micromirror device. The micro oscillating device X3 is manufactured by bulk micromachining technology such as MEMS technology, from a material substrate provided by a SOI wafer. The material substrate has a laminate structure constituted by a first and a second silicon layers and an insulation layer between the silicon layers. Each silicon layer has a predetermined electrical conductivity through doping with impurity. The above-mentioned parts in the micro oscillating device X3 are primarily formed in the first silicon layer and/or the second silicon layer. For the sake of illustrative clarity, hatching is provided in FIG. 21 on those parts which are formed in the first silicon layer and are higher than the insulation layer toward the viewer of the figure. In FIG. 22, the structure shown is formed in the second silicon layer in the micro oscillating device X3.

The micro oscillating device X3 differs from the micro oscillating device X1 provided by the first embodiment in that the oscillating part 10 is replaced by the oscillating part 10', the drive electrode 23 is replaced by the drive electrode 26, and the device does not include the shielded electrode part 24. The frame 21 and the pair of connecting parts 22 in the micro oscillating device X3 are essentially the same as the frame 21 and the pair of connecting parts 22 in the micro oscillating device X1.

The oscillating part 10' includes a land 11, a drive electrode 17, a beam 13, and a shielded electrode part 14, and differs from the oscillating part 10 of the micro oscillating device X1 in that the drive electrode 12 is replaced by the drive electrode 17.

The drive electrode 17 is a part formed in the first silicon layer, and includes a base 17A and electrode teeth 17*a*, 17*b*, 17*c*, 17*d*, 17*e*, 17*f*. As shown in FIG. 21, the electrode teeth 17*a* through 17*f* extend from the base 17A toward the drive electrode 26, and as shown in FIG. 21 and FIG. 24, are in parallel to each other at a space provided in the direction in which the axis A1 extends. The electrode teeth 17*a*, 17*f* are parallel in the direction indicated by Arrow D as shown in FIG. 21, and serve as the first and the second end extensions according to the present invention. The drive electrode 17 is a part where a predetermined reference potential (a ground potential for example) is applied when operating the micro oscillating device X3. The drive electrode 17 as described above serves as the first drive electrode according to the present invention.

As shown clearly in FIG. 23, the drive electrode 26 is a part formed in the second silicon layer, and includes a base 26A and a plurality of electrode teeth 26*a*. As shown in FIG. 21, the electrode teeth 26*a* extend from the base 26A toward the drive electrode 17, and as shown in FIG. 22 and FIG. 24 for example, are in parallel to each other at a space provided in the direction in which the axis A1 extends.

In the micro oscillating device X3, a pair of drive electrodes 17, 26, constitutes a driving mechanism, i.e. an actuator, for generation of a driving force necessary to move the oscillating part 10'. In the driving mechanism, the electrodes 17*a*, 17*f* (the first and the second end extensions) of the drive electrode 17 extend separately from each other in a direction perpendicular to the axis A1. The electrode teeth 17*a*, 17*f*, i.e. a pair of end extensions, provide the outermost parts in the structure of the driving mechanism constituted by the drive electrodes 17, 26, in the direction of extension of the axis A1 which is an axis relevant to the oscillating part 10'. As shown in FIG. 21 and FIG. 24, the drive electrode 26 is provided within a separation distance L3 between the electrode teeth 17*a*, 17*f* described above. The separation distance L3 is 10 through 300 μm for example.

When operating the micro oscillating device X3, a predetermined reference potential is applied to the drive electrode 17 of the oscillating part 10' as described earlier. The application of reference potential to the drive electrode 17 can be achieved via the first-layer piece 21*a* of the frame 21, the torsion bars 22*a* of the connecting parts 22, and the beam 13 of the oscillating part 10'. The reference potential is a ground potential for example, and preferably, maintained at a constant level. Then, by applying a drive potential which is higher than the reference potential to the drive electrode 26, an electrostatic attraction is generated between the drive electrodes 17, 26. When the electrostatic attraction between the drive electrodes 17, 26 is equal to or grater than a predetermined level, the drive electrode 17 is drawn toward the drive electrode 26. Therefore, the oscillating part 10', i.e. the land 11 makes an oscillating movement about the axis A1, making a pivotal displacement to an angle where the electrostatic attraction is balanced by a total of torsional resistances of the twisted connecting torsion bars 22*a*. The amount of pivotal displacement in such an oscillating movement can be controlled by varying the amount of electric potential applied to the drive electrode 26. When the electrostatic attraction between the drive electrodes 17, 26 is turned off, each of the torsion bars 22*a* returns to its natural state. Through the oscillating drive of the oscillating part 10', i.e. the land 11, as described, it is possible to change light reflection directions of the light reflected by the mirror surface 11*a* provided on the land 11.

The electrode teeth 17*a*, 17*f*, which constitute part of the drive electrode 17 in the micro oscillating device X3, provide the outermost parts in the structure of the driving mechanism constituted by the drive electrodes 17, 26, in the direction of extension of the axis A1 which is an axis relevant to the oscillating part 10'. Further, when the device is in operation, a reference potential (a ground potential for example) is applied to the drive electrode 17 including the electrode teeth 17a, 17f. The drive electrode 26 is provided within the separation distance L3 between these electrode teeth 17a, 17f as described as above. Therefore, as a predetermined drive potential which is higher than the reference potential generates an electric field from the drive electrode 26 during device operation, the electric field is likely to be absorbed by the electrode teeth 17a, 17f of the drive electrode 17 (In other words, the electric field from the drive electrode 26 is not likely to leak out of the driving mechanism beyond the electrode teeth 17a, 17f). In addition, according to the micro oscillating device X3, the shielded electrodes parts 14, 21a', 21b' also play a role in the absorption of electric field, just the same way as described in relation to the shielded electrode parts 14, 21a', 21b' in the first embodiment. Therefore, the micro oscillating device X3 is suitable for reducing the electric field leakage out of the device during device operation.

FIG. 26 shows a micro oscillating device array Y3 according to a fifth embodiment. The micro oscillating device array Y3 includes a plurality of micro oscillating devices X3. In the micro oscillating device array Y3, these micro oscillating devices X3 are laid in line (in other words, in one-dimensional manner) along the axis A1. Therefore, in the micro oscillating device array Y3, the mirror surfaces 11a lie in line, in the direction of the axis A1.

In the micro oscillating device array Y3, the first-layer piece 21a of the frame 21 is continuous throughout all of the micro oscillating devices X3. Therefore, all of the drive electrodes 17, the shielded electrode parts 14 of the oscillating parts 10', the shielded electrode parts 21a', 21b' (the first-layer pieces 21a and the second-layer pieces 21b) in the frames 21 in the micro oscillating devices X3 are electrically connected with each other.

When the micro oscillating device array Y3 is operated, a predetermined reference potential is applied commonly to the drive electrode 17 of the oscillating part 10' in all of the micro oscillating devices X3, and under this state, a predetermined potential is applied to the drive electrode 26 in selected ones of the micro oscillating devices X3. With this arrangement, it is possible to operate the oscillating part 10', i.e. the land 11, in each micro oscillating device X3 individually, and to change light reflection directions of the mirror surface 11a formed on the land 11 in each of the micro oscillating devices X3. Each micro oscillating device X3 is driven as described specifically in relation with the fourth embodiment.

As described earlier in relation to the fourth embodiment, in each micro oscillating device X3, the electrode teeth 17a, 17f provide the outermost parts in the direction in which the axis A1 extends, in the structure of the driving mechanism (drive electrodes 17, 26), and in addition, the drive electrode 26 is provided within the separation distance L3 between the electrode teeth 17a, 17f which are supplied with a reference potential (a ground potential for example) when the device is in operation. Therefore, as a predetermined drive potential which is higher than the reference potential generates an electric field from the drive electrode 26 during device operation, the electric field is likely to be absorbed by the electrode teeth 17a, 17f of the drive electrode 17, which means that electric field leakage to outside of the device is reduced. Therefore, according to the micro oscillating device array Y3, the problem of leaked electric field, i.e. that electric field leakage from the driving mechanism (drive electrodes 17, 26) in one of the micro oscillating devices X3 can cause undue adverse affect to the operation characteristic of the adjacent micro oscillating devices X3, is reduced. The micro oscillating device array Y3 as described above is suitable for achieving a small mounting pitch between a plurality of the micro oscillating devices X3, and therefore between a plurality of the mirror surfaces 11a. In other words, the micro oscillating device array Y3 is suitable in increasing device density of the micro oscillating devices X3, i.e. the mirror surfaces 11a.

As described earlier in relation with the fourth embodiment, the shielded electrodes parts 14, 21a', 21b' in each micro oscillating device X3 can also play a role in the absorption of electric field. These effects of electric field absorption provided by each of the shielded electrodes parts 14, 21a', 21b' also help reducing the problem of electric field leakage that electric field leakage from the driving mechanism (the drive electrodes 17, 26) in one of the micro oscillating devices X3 can cause undue adverse affect to the operation characteristic of the adjacent micro oscillating devices X3.

The invention claimed is:

1. A micro oscillating device comprising:
at least one frame;
an oscillating part including a first drive electrode to apply a reference electric potential;
a connecting part to connect the frame and the oscillating part to each other, the connecting part defining an axis of an oscillating motion of the oscillating part; and
a second drive electrode fixed to the frame and cooperating with the first drive electrode to generate a driving force for the oscillating movement;
wherein the first drive electrode includes a first end extension and a second end extension separated from each other and extending in a direction crossing the axis,
wherein the second drive electrode is within a separation distance between the first and the second end extensions,
wherein the first drive electrode includes a plurality of electrode teeth extending from the first end extension toward the second end extension in parallel to each other at a space provided in a direction which the first end extension extends, the first drive electrode further including a plurality of electrode teeth extending from the second end extension toward the first end extension in parallel to each other at a space provided in a direction which the second end extension extends, and wherein the second drive electrode includes an arm extending along the first and the second end extensions, a plurality of electrode teeth extending from the arm toward the first end extension in parallel to each other at a space provided in a direction which the arm extends, and a plurality of electrode teeth extending from the arm toward the second end extension in parallel to each other at a space provided in the direction which the arm extends.

2. The micro oscillating device according to claim 1, further comprising an additional frame, an additional connecting part and a driving mechanism, wherein the additional connecting part connects said one frame and the additional frame to each other and defines an additional axis extending in a direction crossing the axis for the oscillating movement of said one frame, and wherein the driving mechanism generates a driving force for the oscillating movement of said one frame.

3. The micro oscillating device according to claim 1, wherein the oscillating part further includes a movable functioning section and a first shielded electrode part, the first shielded electrode part being between the movable functioning section and the second drive electrode.

4. The micro oscillating device according to claim 3, wherein the micro oscillating device is obtained by processing a material substrate having a laminate structure that includes a first conductive layer, a second conductive layer and an insulation layer between the first and the second conductive layers, wherein the movable functioning section is formed in the first conductive layer, the second drive electrode and the first shielded electrode part being formed in the second conductive layer.

5. The micro oscillating device according to claim 1, further comprising a second shielded electrode part bonded to the arm via an insulation layer.

6. The micro oscillating device according to claim 5, wherein the micro oscillating device is obtained by processing a material substrate having a laminate structure that includes a first conductive layer, a second conductive layer and an insulation layer between the first and the second conductive layers, wherein the second shielded electrode part is formed in the first conductive layer, the arm being formed in the second conductive layer.

7. The micro oscillating device according to claim 1, wherein the frame includes a frame main body and a third shielded electrode part.

8. The micro oscillating device according to claim 7, wherein the micro oscillating device is obtained by processing a material substrate having a laminate structure that includes a first conductive layer, a second conductive layer and an insulation layer between the first and the second conductive layers, wherein the first drive electrode and the third shielded electrode part are formed in the first conductive layer, the second drive electrode and the frame main body being formed in the second conductive layer.

9. The micro oscillating device according to claim 8, wherein the first, the second and the third shielded electrode parts as well as the first drive electrode are electrically connected with each other.

10. The micro oscillating device according to claim 8, wherein the frame main body includes a fourth shielded electrode part.

11. The micro oscillating device according to claim 10, wherein the first, the second, the third and the fourth shielded electrode parts as well as the first drive electrode are electrically connected with each other.

12. A micro oscillating device array comprising a plurality of micro oscillating devices set forth in claim 1.

13. The micro oscillating device array according to claim 12, wherein the axes of the micro oscillating devices are parallel to each other.

14. The micro oscillating device array according to claim 12, wherein the reference potential is applicable commonly to the first drive electrodes of the oscillating parts in the respective micro oscillating devices, whereas an electric potential is applicable individually to the second drive electrode in each of the micro oscillating devices.

* * * * *